(12) United States Patent
Nespeca et al.

(10) Patent No.: US 11,114,126 B2
(45) Date of Patent: Sep. 7, 2021

(54) DISK DRIVE SERVER

(71) Applicants: Nicholas Aldo Nespeca, Boulder, CO (US); Jon Benson, Boulder, CO (US); Stephen P. Neisen, Fort Collins, CO (US); Matt John Ninesling, Arvada, CO (US)

(72) Inventors: Nicholas Aldo Nespeca, Boulder, CO (US); Jon Benson, Boulder, CO (US); Stephen P. Neisen, Fort Collins, CO (US); Matt John Ninesling, Arvada, CO (US)

(73) Assignee: Spectra Logic Corporation, Boulder, CO (US)

( * ) Notice: Subject to any disclaimer, the term of this patent is extended or adjusted under 35 U.S.C. 154(b) by 0 days.

(21) Appl. No.: 16/829,001

(22) Filed: Mar. 25, 2020

(65) Prior Publication Data

US 2020/0290822 A1    Sep. 17, 2020

Related U.S. Application Data

(63) Continuation of application No. 16/820,646, filed on Mar. 16, 2020, now Pat. No. 10,943,617.
(Continued)

(51) Int. Cl.
*G11B 19/08* (2006.01)
*G06F 3/06* (2006.01)
(Continued)

(52) U.S. Cl.
CPC ............. *G11B 19/28* (2013.01); *B65G 47/90* (2013.01); *G06F 3/0625* (2013.01); *G06F 3/0658* (2013.01); *G06F 3/0679* (2013.01); *G06F 9/44505* (2013.01); *G11B 5/2655* (2013.01); *G11B 19/08* (2013.01); *G11B 19/209* (2013.01); *G11B 33/0466* (2013.01);
(Continued)

(58) Field of Classification Search
CPC ... G06F 3/0683; G06F 3/0689; G11B 19/209; G11B 19/08; G11B 33/126; H01R 13/642; H05K 1/111
See application file for complete search history.

(56) References Cited

U.S. PATENT DOCUMENTS 7,822,917 B2 * 10/2010 Lodolo ................. G06F 3/0653
                                                          711/112
2006/0039106 A1 * 2/2006 Hidaka ................. G11B 33/128
                                                          361/679.38
(Continued)

*Primary Examiner* — David E Martinez
(74) *Attorney, Agent, or Firm* — Kenneth Altshuler

(57) ABSTRACT

A server box embodiment is disclosed that generally comprises an array of dummy HDDs that share a common set of universal disk drive components in a master components module, or power module. Each dummy HDDs is constructed without expensive onboard chipsets that control the normal functionality of a standard HDD. By sharing expensive chipsets in a master components module (power module) money can be saved in building and selling the dummy HDD server. Embodiments envision a power module possessing the needed chipset functionality that is missing in a dummy HDD. The power module can be made to move from dummy HDD to dummy HDD supplying the necessary chipset in a shared manner when data is being stored or retrieved for client or end-user.

21 Claims, 20 Drawing Sheets

Related U.S. Application Data

(60) Provisional application No. 62/818,325, filed on Mar. 14, 2019.

(51) Int. Cl.
| | |
|---|---|
| *G11B 19/20* | (2006.01) |
| *G11B 33/12* | (2006.01) |
| *H01R 13/642* | (2006.01) |
| *H05K 1/11* | (2006.01) |
| *G11B 19/28* | (2006.01) |
| *G11B 5/265* | (2006.01) |
| *G06F 9/445* | (2018.01) |
| *B65G 47/90* | (2006.01) |
| *G11B 33/04* | (2006.01) |
| *H01R 13/24* | (2006.01) |
| *H05K 1/18* | (2006.01) |
| *H05K 7/14* | (2006.01) |

(52) U.S. Cl.
CPC ........... *G11B 33/126* (2013.01); *H01R 13/24* (2013.01); *H01R 13/642* (2013.01); *H05K 1/111* (2013.01); *H05K 1/181* (2013.01); *H05K 7/1489* (2013.01); *H05K 2201/10159* (2013.01); *H05K 2201/10189* (2013.01)

(56) References Cited

U.S. PATENT DOCUMENTS

| | | | |
|---|---|---|---|
| 2006/0039108 A1* | 2/2006 | Chikusa | G11B 33/128 361/695 |
| 2008/0140921 A1* | 6/2008 | Sutardja | G06F 3/0634 711/103 |
| 2014/0174972 A1* | 6/2014 | Li | G06F 1/187 206/457 |
| 2018/0097301 A1* | 4/2018 | Yoshida | G11B 33/02 |

* cited by examiner

DISK DRIVE SERVER

CROSS-REFERENCE TO RELATED APPLICATIONS

This application is a continuation of and claims priority to U.S. patent application Ser. No. 16/820,646, entitled SHARED DISK DRIVE COMPONENT SYSTEM filed Mar. 16, 2020, which in turn claims priority to and the benefit of U.S. Provisional Patent Application Ser. No. 62/818,325, entitled SHARED DISK DRIVE COMPONENT SYSTEM filed Mar. 14, 2019, the entire disclosure of which is hereby incorporated by reference.

BACKGROUND OF THE INVENTION

1. Field of the Invention

The present invention relates generally to shared drive components used with multiple disk drives in an array of disk drives.

2. Description of Related Art

The disk drive industry is becoming commoditized with the leveling off of data storage capacity and the rate at which data is extracted or sent for storage. Furthermore, the disk drive industry is getting ever increasing pressure from solid state drives (SSDs). Accordingly, manufacturers that use hard disk drives (HDDs) in their servers are running out of room on lower price or extracting profit from server system. In other words, there is not much financial margin today in manufacturing and selling servers constructed from HDDs.

FIG. 1A illustratively depicts a prior art top view drawing of an HDD without a cover. In general, a magnetic HDD 99 fundamentally retains or otherwise stores digital data to a magnetic disk 10 via a magnetic recording head 8 that writes data tracks 14 while the disk is spinning under the magnetic recording head 8. An HDD 99 essentially comprises a head stack assembly, HSA, 17 that cooperates with a disk assembly 19 and the necessary electronics. With regards to the disk assembly 19, one or more magnetic disks 10 are stacked over a spindle motor 12 attached to the base-plate 18 and clamped in place via a clamping ring 9 screwed into the spindle motor 12 via bolts 11. Magnetic disks 10 generally comprise an aluminum substrate covered by an exotic metallic paramagnetic thin film covered by a protective diamond like carbon (DLC) thin film overcoat and lubricated on the outermost surface with a perflourinated-ether lubricant. The lubricant protects the DLC from wear of the magnetic head 8 that interfaces the magnetic disk 10 in a rotary motion when the spindle motor 12 is spinning. With particular attention to the HSA 17, a magnetic recording head 8 is retained in constant pressure on the disk surface by a head suspension 6 that is swaged on the end of an E-block 16, as shown. The E-block 16 is so named because a side view of the E-block 16 has protruding fingers that poorly resemble the letter "E". The HSA 17 is pivotally attached to the base-plate 18 via a pivot bearing 4. The voice coil magnet 2 obscures the back end/coil end of the HSA 17, which together comprise the voice coil motor 3. The voice coil magnet 2 is a strong hard-magnet, which is typically made from a neodymium, with a north pole side (+) and a south pole side (−) that facilitates actuating the HSA 17 across the magnetic disk 10 depending on how current is moving through the voice coil wire (not shown). The printed circuit board 60, on the bottom/obverse side of the base-plate 18 (see FIG. 1C), receives power through the power pins 22 and a communications cable connection 20 (such as a SAS, SATA, SCSI, or other communications interface cable). For reference, receiving screw holes 24 are shown that receive screws 44 to fixedly attach an HDD cover 40 (see FIG. 1B).

FIG. 1B illustratively depicts a top view of an HDD with essentially the same components as of FIG. 1A. As shown here, the HSA 17 is attached to the base plate 18 via the HSA pivot bearing 4 with the distal end of the HSA 17 being the magnetic head 8 glued onto a head suspension 6. The head suspension 6 is swaged 7 on to the E-block 16 by way of two pins pressed into two accommodating holes in the E-block 16. The proximal end of the HSA 17, being the voice coil 30, for the voice coil motor, is inside of a frame or yoke 32 in this case. When electrical current is applied to the voice coil 30 in one direction, the proximal end of the HSA 17 biases towards the hard magnet 2 in the "−" direction, and when electrical current is applied to the voice coil 30 in and opposite direction, the proximal end of the HSA 17 biases towards the hard magnet 2 in the "+" direction. The hard magnet 2 in combination with the voice coil 30 generally comprises the voice coil motor 3.

As shown in FIG. 1C, while the hard magnetic disk 10 is spinning (see arrow 34) when the voice coil 30 is energized to move the distal end of the HSA 17 in the "+" direction of the hard magnet 2 (see arrow 38), the magnetic head 8 pivots in the opposite direction (see arrow 36). In this way, the head 8 moves along (is confined to) an arced pathway over the disk 10, from right to left. Though this figure has the simple components for ease of description, all the components shown are encased (and substantially sealed) between a disk drive cover 40 and the disk drive baseplate 18. The magnetic head 8 hovers, or is otherwise supported over the hard disk 10 by an air bearing generated from the spinning hard disk 10. In this way, the magnetic head 8 is able to write data tracks that are concentric to the circular disk 10.

FIG. 1D illustratively depicts the partial view of the top side HDD 99 with a communications interface cable 46 adapted to plug into the communications cable connection 20 and a power cable 42 adapted to plug into the power pins 22. The HDD cover 40 is shown screwed on to the base-plate 18 via screws 44, as shown. The communications interface cable 46 has a female adapter/socket 58 that plugs into the pins 19 at the PCB plug housing 21.

FIG. 1E illustratively depicts the bottom side of the HDD 99 showing the printed circuit board (PCB) 60 attached to the HDD bottom surface 76. The HDD 99 possesses four bolt holes 74 that facilitate attaching the HDD 152 a chassis for a computer or computing device. The PCB 60 and non-described electronic chips are crosshatched. The PCB 60 and spindle motor 62 receive power via the power connector 22 and electrical data signals via the communications connector 20. Some of the main components of the chipset include the CPU 64, RAM, or buffer memory, IC chip 66 and the read channel 72. Power is provided to the spindle motor 62 by way of the motor electrical contacts 68, which are connected to the power connector 22 via leads under the PCB 60.

It is to innovations related to more efficiently using HDDs in and array in a server system that the subject matter disclosed herein is generally directed.

SUMMARY OF THE INVENTION

The present invention generally relates to a server box that comprises a plurality of dummy HDDs positioned in an array within the server box wherein the dummy HDDs share a common set of universal disk drive components comprised by a master components module. Embodiments envision the dummy HDDs being incomplete HDDs in that they are devoid of the typical onboard chipset that controls a normal functionality a standard HDD (as well as other potential universal components). Certain embodiments further envision the dummy HDDs being devoid of two-pole voice coil magnets that complete a voice coil motor. The master components module completes the missing elements in the dummy HDD thereby completing the necessary components to form a standard HDD. More specifically, embodiments envision the master components module possessing the chipset functionality that are missing in the dummy HDDs, and in certain embodiments the two-pole voice coil magnets. Certain embodiments envision the master components module engaging one of the dummy HDDs to form a functional/complete HDD that is able to transfer data to an end user, or client. In this way, a plurality of dummy HDDs can exist in a server sharing a single master components module thereby eliminating the need for each HDD requiring its own set of chips and/or other related components. Because the number of chipsets are reduced, money can be saved, which can in turn lowers the cost of a server. Some embodiments envision the master components module adapted to traverse an array of dummy HDDs and selectively engaging a target HDD (thereby completing the needed components of the target HDD) to store and/or retrieve data for client/end user.

One embodiment of the present invention envisions a power module comprising: a hard disk drive (HDD) microcontroller; a bus connector configured to connect with a power bus that provides power and communication to the power module; and a two position connector pin array that comprises a plurality of connector pins that correspond to an array of electrical pads from a dummy HDD, the dummy HDD devoid of at least an onboard HDD microcontroller, the two position connector pin array configured to connect with the dummy HDD when in a first position but not configured to connect with the dummy HDD when in a second position.

Other embodiments contemplate a power module operation method comprising: supplying power and the communication link to the power module via a power and communication bus that is connected to the power module; receiving instructions to engage a dummy HDD; moving a two position connector pin array from a first position to a second position, the pin array comprises a plurality of connector pins; after the moving step, electrically engaging the plurality of connector pins with a pad array disposed on the dummy HDD, the pad array that corresponds with the pin array; and providing controller functionality to the dummy HDD, the controller functionality required to bring the dummy HDD to a ready state, the dummy HDD devoid of at least an onboard HDD controller functionality.

Yet other embodiments contemplate a dummy hard disk drive (HDD) comprising: at least one magnetic disk mounted to a spindle motor, the spindle motor attached to a base plate, the at least one magnetic disk consisting of a rigid disk smaller than 4 inches in diameter; a plurality of magnetic heads each located distally on spring-loaded suspension, each of the spring-loaded suspensions swaged to an E-block, the E-block attached to a pivot bearing, the pivot bearing 4 attached to the base plate, the magnetic heads confined to an arched pathway over the at least one magnetic disk because of the pivot bearing; a primary circuit board devoid of an onboard disk drive controller, the onboard disk drive controller is configured to facilitate communication between the dummy HDD and a central processing unit (CPU); a plurality of electrical contact points that are configured to electrically cooperate with a plurality of corresponding electrical connectors, the electrical connectors are external to the dummy HDD; and the electrical connectors electrically connected to an external disk drive controller that is adapted to control at least the dummy HDD and a different dummy HDD.

DETAILED DESCRIPTION

Initially, this disclosure is by way of example only, not by limitation. Thus, although the instrumentalities described herein are for the convenience of explanation, shown and described with respect to exemplary embodiments, it will be appreciated that the principles herein may be applied equally in other types of situations involving similar uses of server systems with shared hard disk drive components. In what follows, similar or identical structures may be identified using identical callouts.

Currently, just about all profit is squeezed out from HDD server systems due to cheap labor in China and other countries that practice low to no labor regulations. Given the thin profit margins on HDD server systems, there is little appetite in manufacturing HDD server systems in developed countries, such as the United States. Accordingly, certain nontraditional HDD server system configurations are contemplated herein, which provide server efficiency and can be manufactured and sold profitably.

Along these lines, certain embodiments contemplate a server box that comprises a plurality of dummy HDDs arranged in an array within the server box wherein the dummy HDDs share a common set of universal disk drive components in a master components module, or power module. Certain embodiments envision a dummy HDD devoid of the typical onboard chipset that controls a normal functionality a standard HDD (as well as other potential universal components). Some embodiments further contemplate a dummy HDD devoid of the standard two-pole voice coil magnets that complete a voice coil motor. In this light, the master components module completes the missing elements in the standard HDD. More specifically, embodiments envision the master components module possessing the needed chipset functionality that is missing in a dummy HDD and in the case of a dummy HDD deprived of voice coil magnet/s, the master components module would further comprise the needed shareable two-pole voice coil magnet/s. Hence, the master components module is envisioned to engage one of the dummy HDDs to form a functional/complete HDD that is able to meet the data storage needs of a standard HDD for an end user, or client. In this way, a plurality of dummy HDDs can exist in a server and share a single master components module thereby saving money and/or lowering the cost of a server. The master components module can be adapted to traverse an array of dummy HDDs and selectively engaging a target HDD to store and/or retrieve data for a client/end user.

Figure 2A:
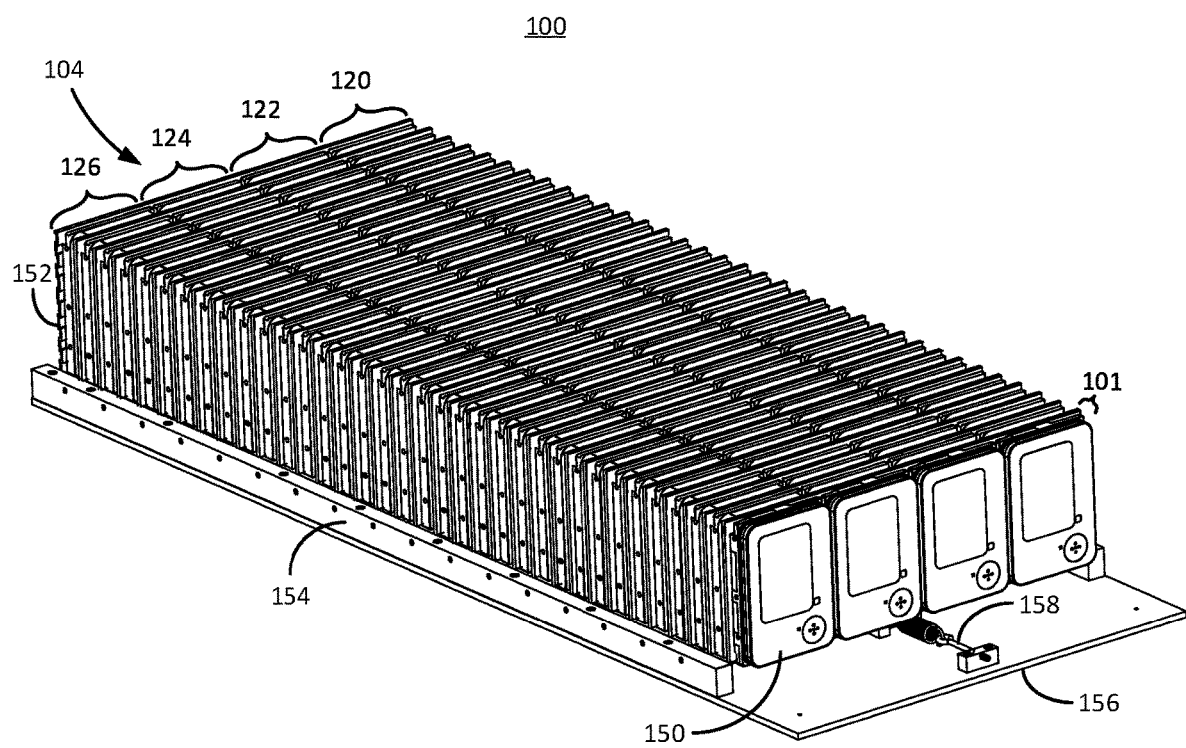
FIGS. 2A and 2B, shown therein are isometric line drawings of a server embodiment with a plurality of dummy HDDs consistent with embodiments of the present invention.
Figure 2B:
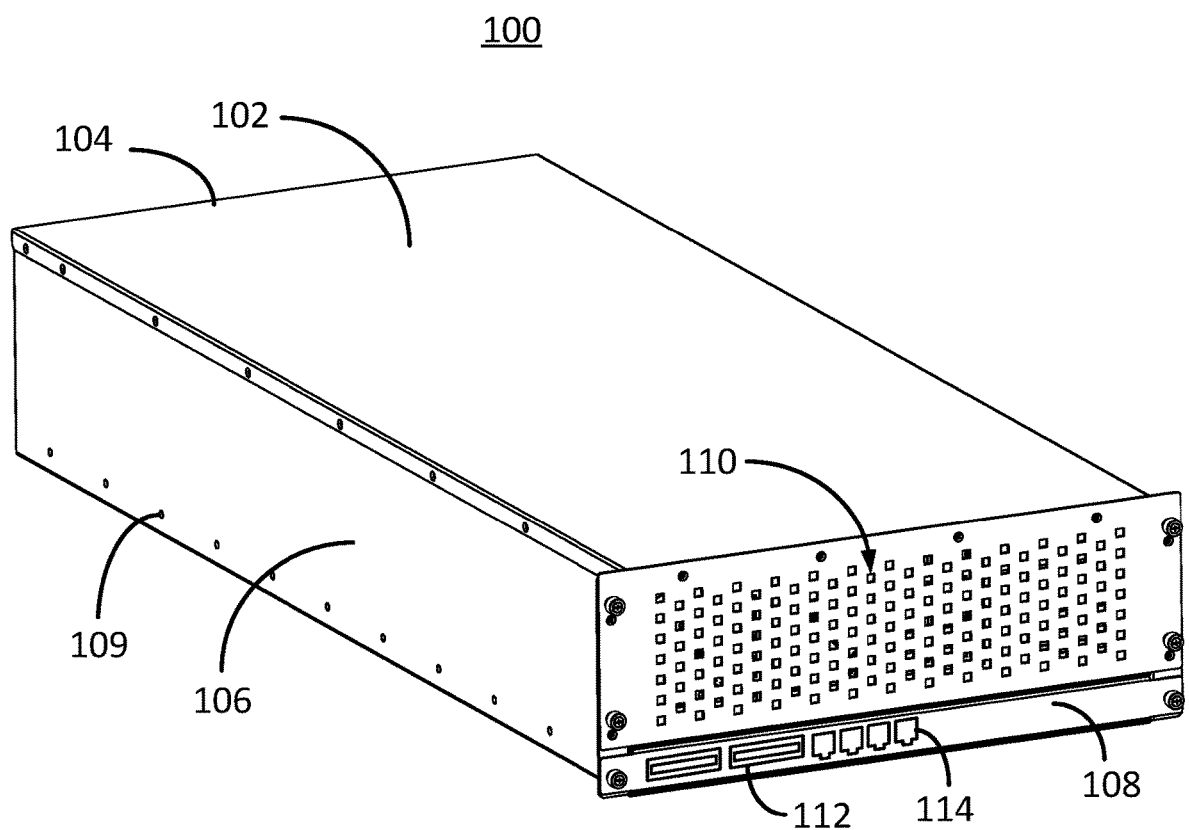

Referring to the drawings in general, and initially to FIGS. 2A and 2B, shown therein are isometric line drawings of a server embodiment 100 with a plurality of dummy HDDs consistent with embodiments of the present invention. FIG. 2A depicts a server embodiment 100 without a cover to show the array of dummy HDDs 150. In this embodiment, there are thirty-five rows 101 and four columns 120, 122, 124 and 126 of dummy HDDs 150 that are each bolted to a HDD chassis plate 152. A generic row of dummy HDDs 150 is be designated herein as element 101. The HDD chassis plates 152 are attached to the server base 156 via the side rails 154. FIG. 2B illustratively depicts the server 100 of FIG. 2A with a cover 102 consistent with embodiments of the present invention. As shown, the server 100 is attached to the base 156 by way of bolts 109 (or some other attachment concept known to those skilled in the mechanical arts) shown at the server side 106. On the front of the server 108 are plurality of vent holes/perforations 110 that provide airflow through the server interior, which can also be located on the back of the server 104. Other embodiments envision vent holes elsewhere along the server cover 102 to better facilitate airflow and cooling of the server system 100. Certain embodiments envision an active cooling system, such as an internal fan (not shown), while other embodiments envision passive cooling from an air-conditioned room. The present server embodiment 100 is depicted with no fan because of the low heat generation from powering only one row 101 of (four) dummy HDDs 150 at a time. In other words, the present server embodiment 100 only powers one row 101 of HDDs 150 at a time, which generates a small amount of heat easily dissipated by passive cooling through vents in the server cover 102.

As further shown, a plurality of data network interface connectors 112 and 114 are depicted on the front surface 108 of the server cover 102. The data network interface connectors 112 and 114 can be high-speed ethernet connectors, such as BNC series connectors, DB series connectors, V series connectors, RJ series connectors, Centronics series connectors, fiber-optic series connectors, HD series connectors, SCSI series connectors, ATA, SAS, USB, and a host of additional connectors used for server systems (such as NAS, LAN, WAN, SAN, DAS or other attached storage systems) known to those skilled in the art. The back surface 104 of the storage system 100 can also support data network interface connectors 112/114 without departing from the scope and spirit of the present invention. The data network interface connectors 112/114 can be used to connect to a network of other servers, the Internet, or a cloud system, just to name a few architectures, which commonly utilize server systems.

Figure 3A:
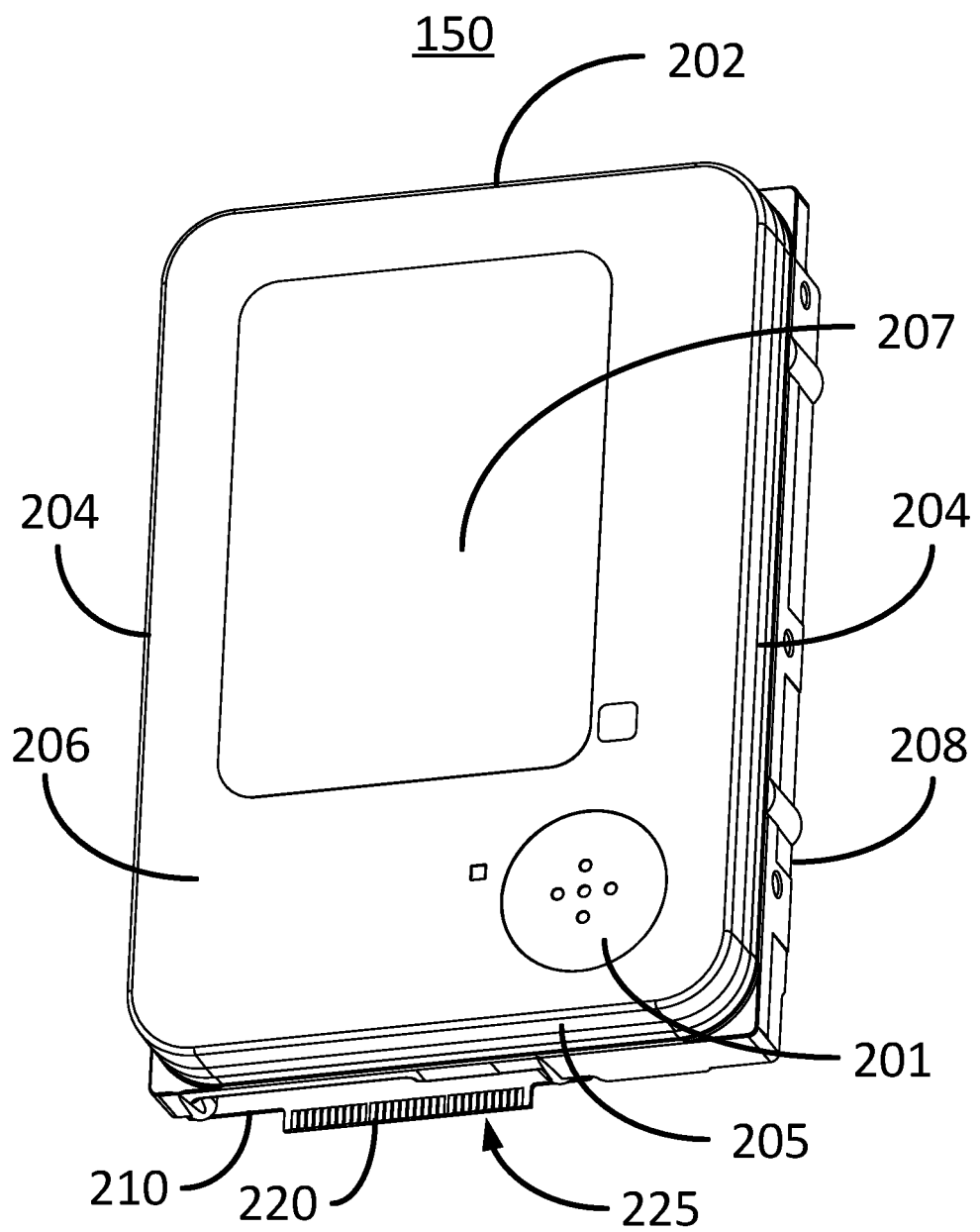
FIGS. 3A and 3B illustratively depict a dummy HDD embodiment consistent with embodiments of the present invention.
Figure 3B:
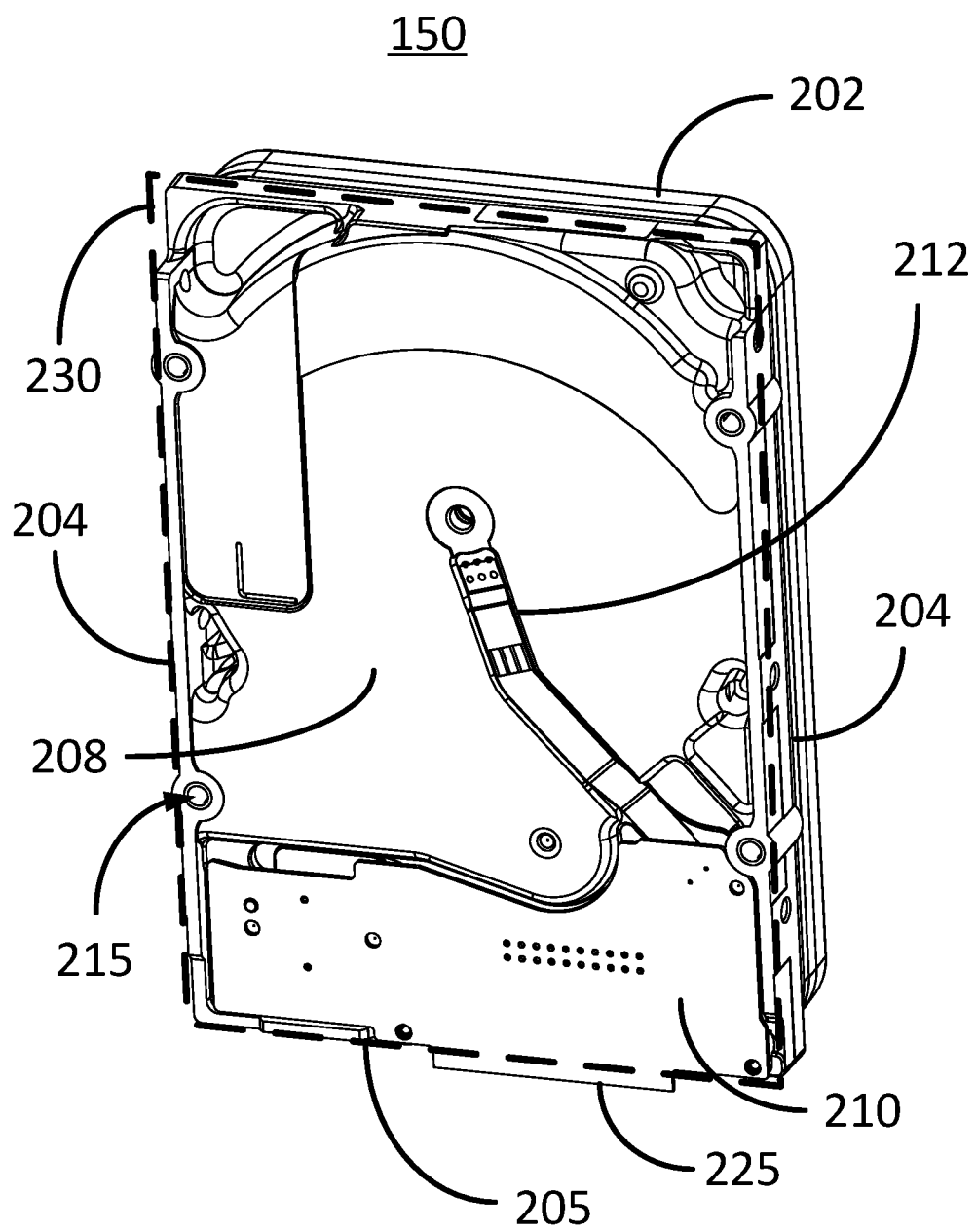

FIGS. 3A and 3B illustratively depict a dummy HDD embodiment 150 consistent with embodiments of the present invention. FIG. 3A illustratively depicts a front view of the dummy HDD 150 (the case/cover) roughly geometrically defined by a front surface 206, a back surface 208, left and right sides 204, a top side 202 and a bottom side 205. In this embodiment, the dummy PCB 210 comprises a connector tab 225 extending from the bottom side 205, as shown. The connector tab 225 comprises a plurality of electrical connector pads 220 viewable from only the front surface 206. Other embodiments envision the electrical connector pads 220 viewable from only the back surface 208. In the present embodiment, each of the electrical connector pads 220 corresponds to a connector pin 19 from the communications cable connection 20 and power pins 22 from a standard HDD 99. Of course, a skilled artisan will appreciate that the electrical connector pads 220 need only facilitate power to the dummy HDD 150 and communication between the dummy HDD 150 and the outside world via corresponding electrical connector pins 452 of FIG. 5B. The present dummy HDD 150 further comprises a cover vibration dampener 207, a breather port and filter 201. Other dummy HDD embodiments are not limited to these particular arrangements of HDD 150.

Figure 1A:
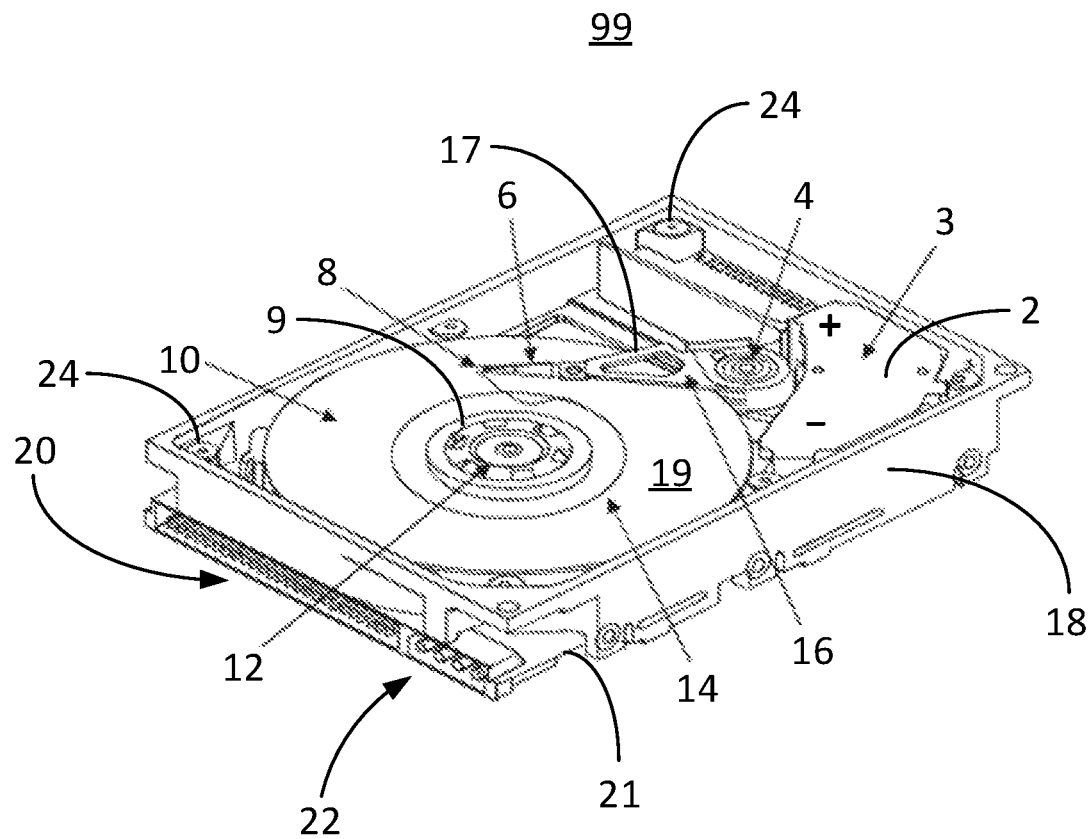
FIGS. 1A-1B illustratively depict a line drawing of a prior art top view drawing of an HDD and associated components without the cover.
Figure 1B:
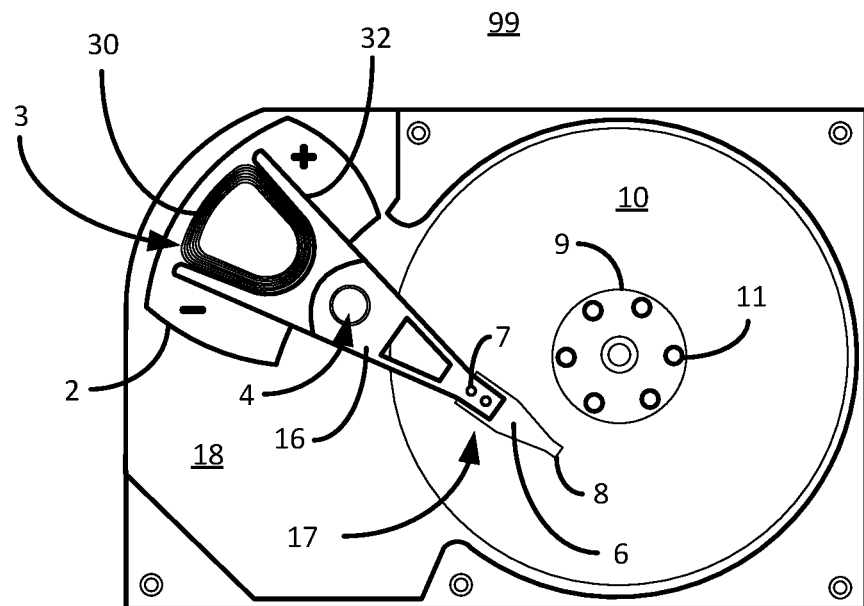
Figure 1C:
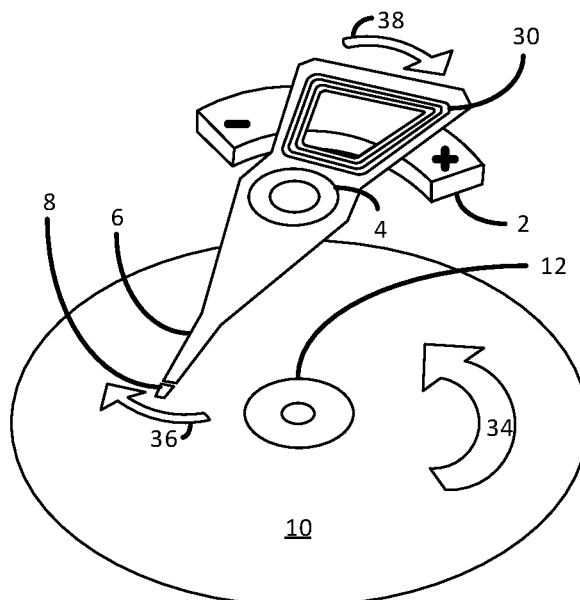
FIG. 1C illustratively depicts a line drawing of a voice coil motor in operation sweeping a magnetic head over a spinning disk.
Figure 1D:
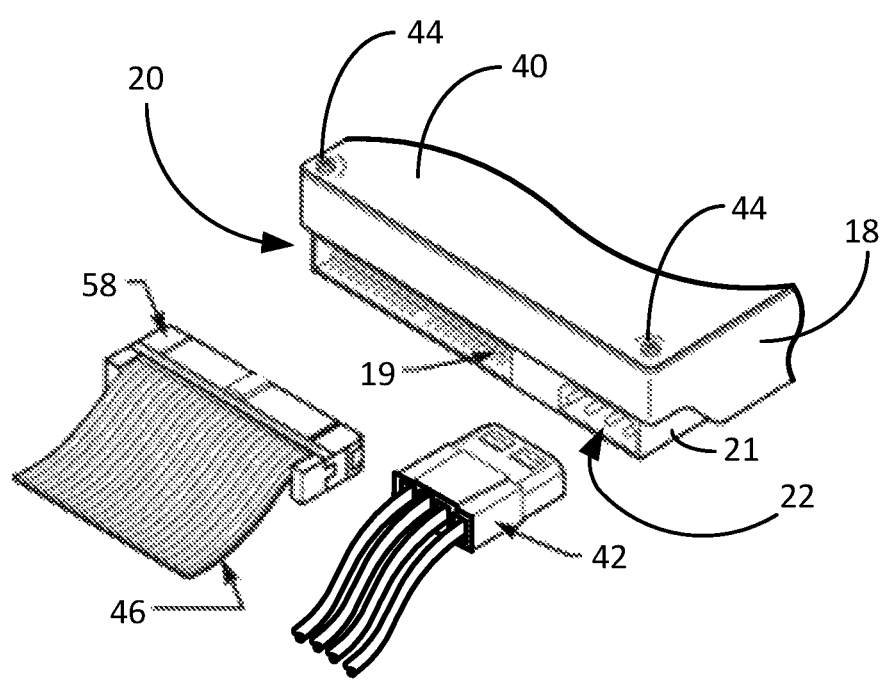
FIG. 1D is a prior art partial view drawing of the top side HDD 100 with a communications interface cable adapted to plug into the communications cable connection and a power cable adapted to plug into the power pins.
Figure 1E:
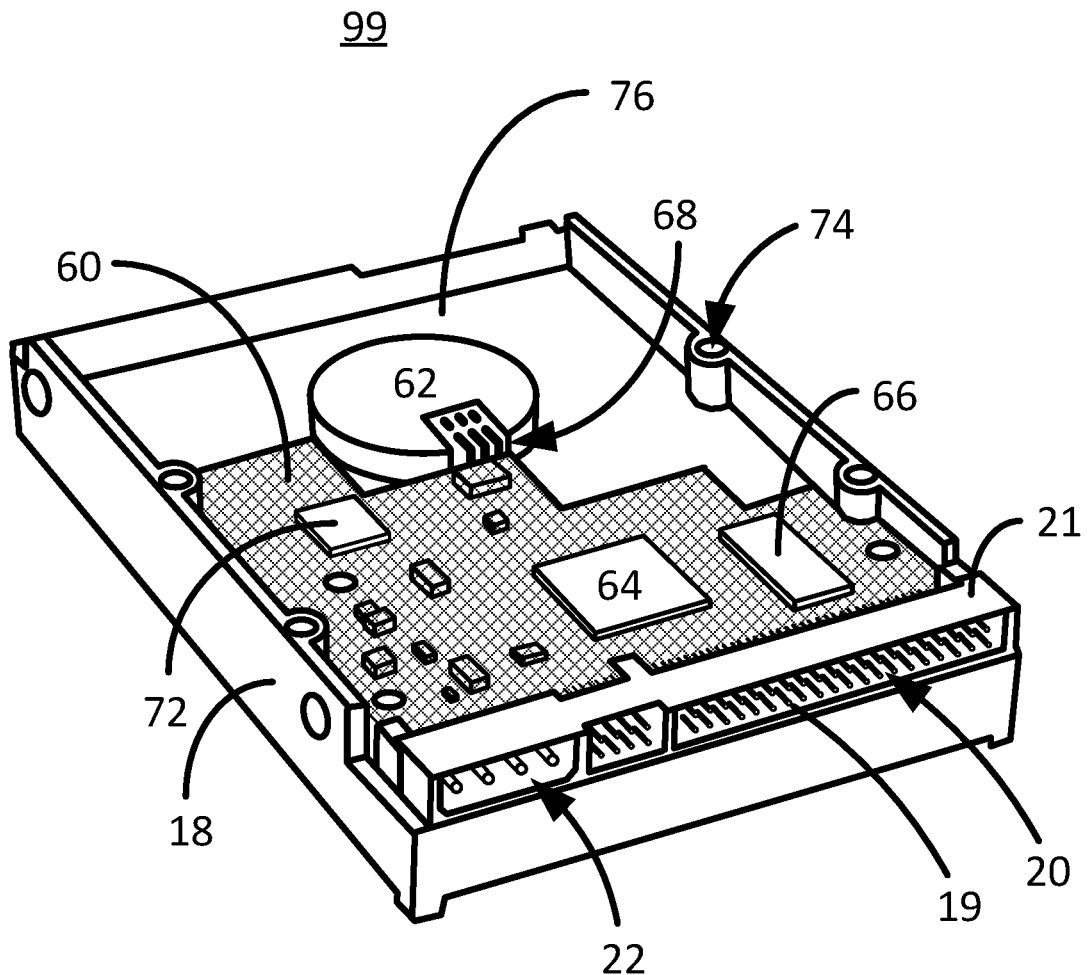
FIG. 1E illustratively depicts a prior art drawing of the bottom side of the HDD 100 showing the printed circuit board (PCB)

FIG. 3B illustratively depicts a back surface 208 view of the dummy HDD 150 consistent with embodiments of the present invention. Unlike the prior art HDD 99 of FIG. 1C, the dummy PCB 210 is smaller, comprises few to no circuit chips, and in some embodiments, few to no primary circuit chips (like a read channel chip, HDD controller microprocessor chip, EPROM, and/or buffer memory), and does not have connector pins 19 or a connector housing 21 like the prior art PCB 60, just to name several differences. The dashed line that frames the outer edge of the back surface 208 essentially shows the perimeter 230 of the dummy HDD 150. In this particular embodiment, the two sides 204, the top side 202 and the bottom side 205 essentially define the dummy HDD perimeter 230. The connector tab 225 extends beyond the perimeter 230 so that it can engage or otherwise electrically contact a plurality of electrical connector pins 452. As shown from this vantage, power is transferred from the electrical connector pads 220 the spindle motor 12 by way of a flex circuit 212. The dummy HDD 150 can be bolted to a chassis/plate via bolt holes 215. In this embodiment, the electrical connector pads 220 disposed on the connector tab 225 are not viewable from the back surface 208.

Figure 4A:
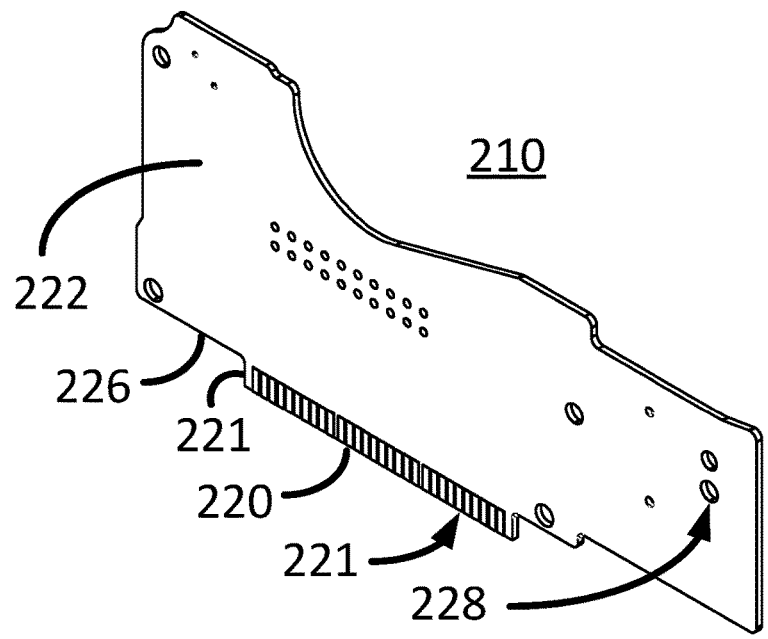
FIGS. 4A-4C illustratively depict different line drawing perspectives of a dummy HDD PCB embodiment consistent with embodiments of the present invention.
Figure 4B:
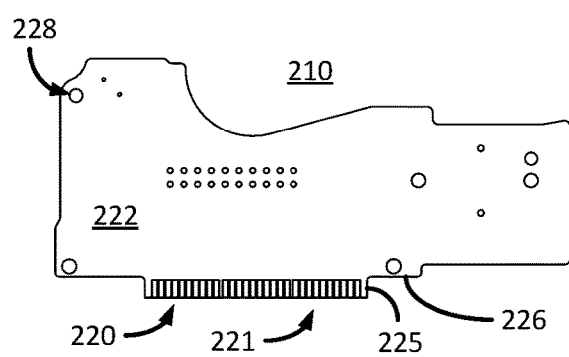
Figure 4C:
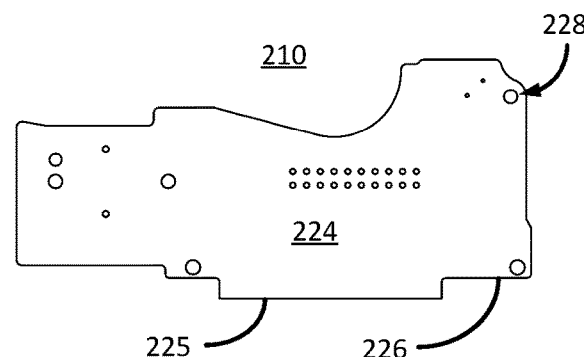

FIGS. 4A-4C illustratively depict different line drawing perspectives of a dummy HDD PCB embodiment consistent with embodiments of the present invention. FIG. 4A shows an isometric line drawing of the front facing side 222 of the dummy PCB 210 wherein the electrical connector pads 220 are viewable. In this embodiment, thirty individual electrical connector pads 220 that comprise a pad array 221. As shown, there are little to no electrical chips on the dummy PCB 210, however in practice the dummy PCB 210 may require some electrical chips, such as resistors or other simple electrical chips, disposed along electrical trace lines, for example. The connector tab 225 extends from the bottom edge 226 to facilitate access to the electrical connector pads 220 by way of an articulating pin connector 450/452 (see the power module 410, shown in FIG. 6B, for example). Though not shown in these figures, the dummy PCB 210 further possesses electrical traces/electrical lines that lead to electrical components of the dummy HDD 150. For example, some of the electrical traces/electrical lines can lead to at least one of the spindle motor 12, the magnetic heads 8, the voice coil 30, head preamplifier/s (not shown), and/other power requiring components in the dummy HDD 150. The dummy PCB 210 can be attached to the back surface 208 of the dummy HDD 150 by way of bolts 44 connecting bolt holes 228 with corresponding bolt holes (not shown) in the dummy HDD base plate back surface 208.

FIG. 4B illustratively depicts a front view of the front facing side 222 of the dummy PCB 210 and FIG. 4C illustratively depicts a back view of the back facing side 224 of the dummy PCB 210 consistent with embodiments of the present invention. As shown, the back facing side 224 of the dummy PCB 210 does not have any electrical connector pads 220 viewably disposed on this surface 224.

Figure 5A:
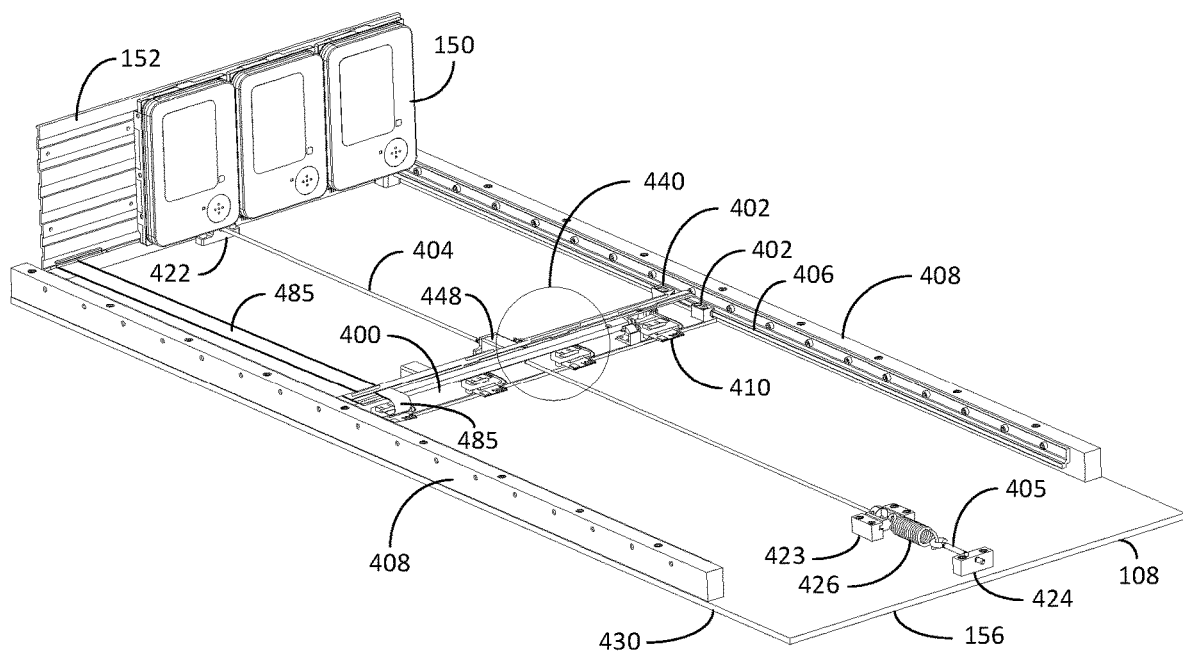
FIG. 5A illustratively depicts an isometric line drawing of the server base of FIG. 2A with all but three drives removed to view a power module and carriage embodiment consistent with embodiments of the present invention.

FIG. 5A illustratively depicts an isometric line drawing of the server base 156 of FIG. 2A with all but three drives removed to view a power module and carriage embodiment consistent with embodiments of the present invention. As shown here, a carriage 400 supports four power modules 410 that can receive power and communication from the outside world via a power bus 485. The power bus 485 is essentially a ribbon with a plurality of conductive lines that in this embodiment is disposed between the dummy HDDs 150 and the server base 156. The power modules 410 are evenly positioned along the carriage 400 to service dummy HDDs 150 along each of corresponding four columns 120, 122, 124 and 126. In other words, the far right power module 410 will service all of the dummy HDDs 150 in only column 120, and so on with the far left power module 410 servicing all of the dummy HDDs 150 in only column 126. In this present depiction, there are three dummy HDDs 150 attached, or bolted in this case, to a chassis plate 152. The carriage 400 is configured to traverse under the dummy HDDs 150 and chassis plates 152 via a carriage motor 448 along a threaded bar 404 that is anchored via a rear anchor block 422 and a front anchor block 424 towards the back 104 and front 108 of the server 100, respectively. In the present configuration, a tension bolt 405, a tension spring 426 and a threaded bar fitting 423 provide some flexibility and constant tension on the threaded bar 404, however other embodiments do not envision the related tension bolt components. Furthermore, in the present configuration the carriage 400 comprises a pair of bearings 402 on each side of the carriage 400 adapted to slide along mating rails 406. The rails 406 can be mounted to the support beams 408 on either side of the server base 156, as shown. The carriage motor 448 can be a stepper motor or some other kind of servo/positioning motor that can move the carriage to a targeted row 101 of dummy HDDs 150. The carriage motor 448 and one of the power modules 410 are encircled 440 to better show this perspective in higher resolution, which is depicted in FIG. 5B.

Figure 5B:
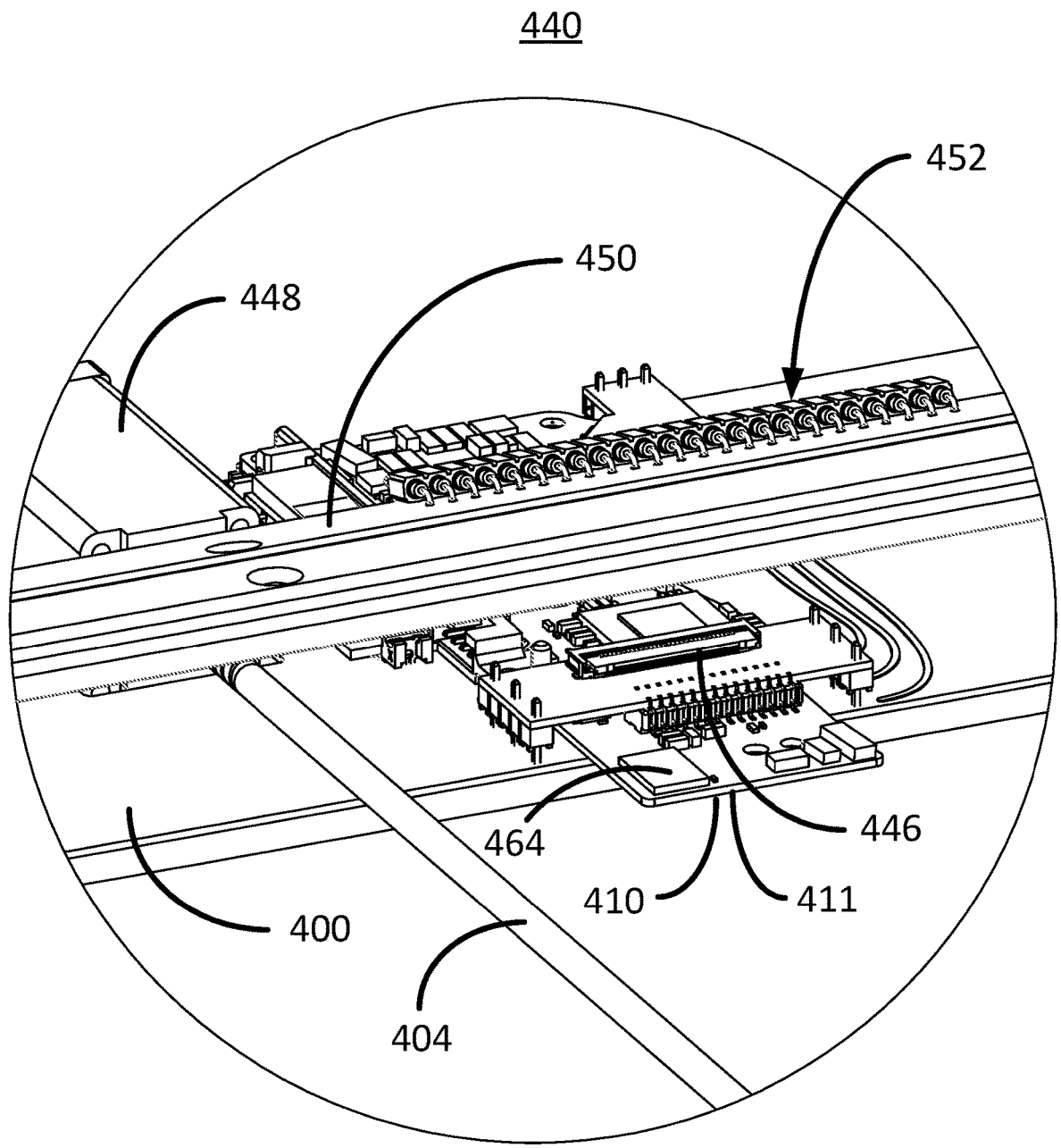
FIG. 5B illustratively depicts a higher resolution view of the carriage motor and a power module from the circle of FIG. 5A consistent with embodiments of the present invention.

FIG. 5B illustratively depicts a higher resolution view of the carriage motor 448 and a power module 410 from the circle 440 of FIG. 5A consistent with embodiments of the present invention. In this embodiment, there are 24 electrical pins 452 as shown extending from a carriage pivot bar 450. The 24 electrical pins 452 comprise a connector pin array 453, which is the collective group of electrical pins 452 that are configured to correspond or otherwise mate with corresponding electrical pads 220. The carriage pivot bar 450 is one embodiment of a two-position connector pin array 453 wherein a first position is that which facilitates the connector pin array 453 to contact mating pads 220 of a dummy HDD 150 and a second position is that which does not facilitate the connector pin array 453 to contact mating pads 220 of a dummy HDD 150 when the power module 410 is simply moved via the carriage 400. The electrical pins 452 are electrically connected with the power module 410, which in this embodiment has a power module PCB 411 that comprises a HDD controller integrated circuit (IC) chip 464, also referred to herein as a HDD controller 464. Certain embodiments envision a bus ribbon 485 being connected to each of the power modules 410 via a bus connector 446, while other embodiments envision a bus linking each of the power modules 410 via the carriage 400. As shown here, one important difference between a dummy HDD 150 and a normal standalone (fully independently operable) HDD 99 is that the HDD controller 464 is external to a dummy HDD 150. The HDD controller 464 possesses many functions that would otherwise be integrated in a standalone HDD 99 including facilitating bringing the dummy HDD 150 to a ready state, controlling motor speed, controlling voice coil motor positioning, and possibly many more complex feedback functions. The HDD controller 464 is an expensive component on a typical standalone HDD 99.

An HDD ready state means that when power is supplied to an HDD, the spindle motor 12 is brought to full speed (typically between 3600-10000 RPM), the magnetic heads 8 are actuated to a designated position over the magnetic disk 10 the HDD is ready to begin interfacing with an external CPU or data user. This simplified ready state definition is extremely simplified. For example, the magnetic heads 8 are often moved off of a ramp (not shown) beyond the outer edge of the magnetic disk 10 when the spindle motor 12 is brought to full speed (or some other acceptable speed where a slider supporting the magnetic head 8 is essentially flying, i.e., it can reliably form an air bearing from the boundary layer flow generated by the spinning magnetic disk 10). Once the magnetic heads 8 are safely flying over the magnetic disk 10, the magnetic heads 8 must locate its position on the magnetic disk 10 by virtue of reading servo data at sector barriers along the thousands of data tracks 14 magnetically written on to the magnetic disk 10. This is accomplished by powering a read channel 72 and linking communication between the read channel 72 and the HDD controller 64 or 464. Once the VCM 3 essentially perfectly positions or otherwise locks the magnetic heads 8 on a designated track, or designated tracks, and all of the internal elements that facilitates communication with the CPU are up and running. Hence, the HDD is in a ready state.

Certain embodiments envision one or more ICs (chipsets) that are normally on a standard HDD PCB 60, e.g., spindle motor controller IC chips (that controls the speed of the spindle motor to a tightly controlled rpm, i.e., 6400 rpm+/−0.2%), read channel IC chips, amplifiers, RAM chips, EEPROM's, etc., being either on the power module 410 or elsewhere so long as the one or more ICs are not residing locally on the dummy HDD 150. Certain other embodiments envision transmitting the functionality of these ICs through the power module 410 whereby some or none of these ICs are actually located on the power module 410. Accordingly, the controlling functions of a normal HDD 99 that typically resides on the PCB 60 are located externally from the dummy HDD 150 and shared between multiple dummy HDDs 150 in order to save more money. In this way, and in reference to the present server embodiment 100, four chipsets can be shared between one hundred and forty dummy HDDs 150 thereby saving the cost of one hundred and thirty six chipsets. In the embodiment wherein the functionality of the chipset is not confined to a specific IC and is rather handled in a master location on the server, or elsewhere, the price of the four chipsets can further be eliminated or reduced. Certain embodiments envision a master controller providing the chipset functionality to a plurality of servers. Hence, if there are fifty servers each with one hundred and forty dummy HDDs 150 wherein each disk drive is controlled by one master controller that provides the chipset functionality, then the cost of an additional two hundred chipsets are saved. Other advantages include eliminating reliability and/or other concerns associated with two hundred chipsets.

Figure 5C:
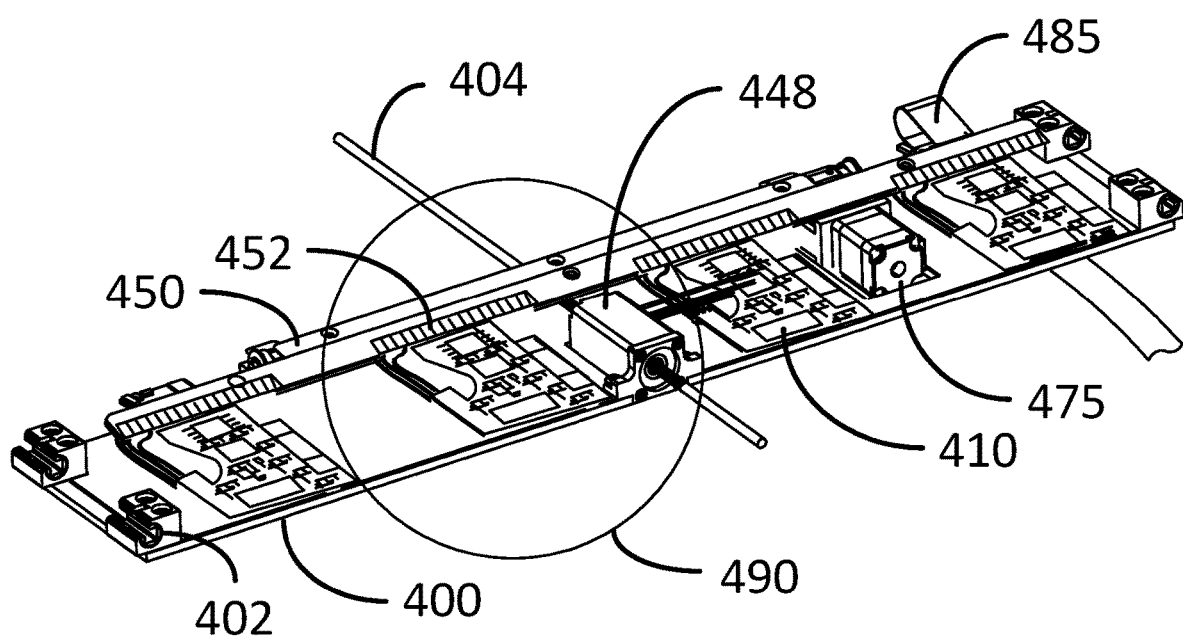
FIG. 5C illustratively depicts and isometric line drawing view of the power module as viewed from the rear portion of the server consistent with embodiments of the present invention.

FIG. 5C illustratively depicts and isometric line drawing view of the power module 410 as viewed from the rear portion 104 of the server 100 consistent with embodiments of the present invention. From this perspective, the carriage motor 448 shows how it can drive along the threaded bar 404 to traverse along the server base 156. As discussed earlier in association with this embodiment, power is provided to the carriage 400 by at least one power bus 485. The four power modules 410 are dispersed along the carriage 400 between the carriage bearings 402, which in this case are in line with the columns 120-126 of dummy HDDs 150. The carriage 400 further comprises a pivot motor 475 that rotates the pivot bar 450 up and down to engage the electrical pin connectors 452 with a corresponding dummy HDD 150, as will be discussed later. The carriage motor 448, a set of connector pins 452, and a power module 410 are encircled 490 to provide a zoomed in view of these components depicted in FIG. 5D.

Figure 5D:
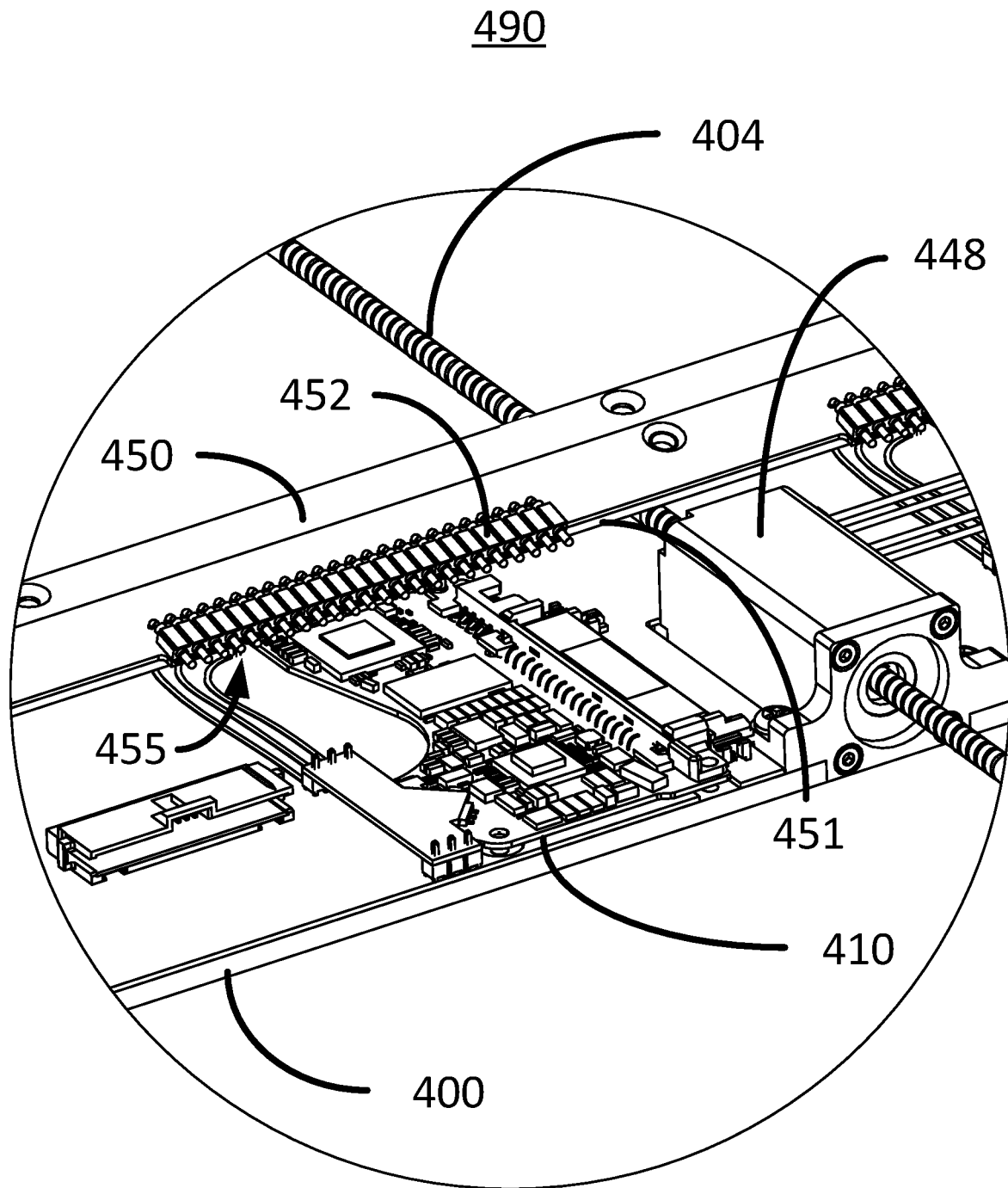
FIG. 5D illustratively depicts the elements within the circle consistent with embodiments of the present invention.

FIG. 5D illustratively depicts the elements within the circle 490 consistent with embodiments of the present invention. In this particular configuration, the carriage motor 448 is located in the center of the carriage 400, however other embodiments envision the carriage motor 448 being located anywhere on the carriage 400. Other embodiments envision the carriage 400 being moved by a motor elsewhere in the server that drives a screw held in place by a bearing on the carriage 400. While yet other embodiments envision the carriage 400 being moved across the server base 156 by some other means known to those skilled in the art. The free ends 455 of the electrical pin connectors 452 (attached to the pivot bar 450 in this embodiment) are extending beyond the pivot bar edge 451. In this figure, the pivot bar 450 is angled in a down position whereby the electrical pin connectors 452, and more specifically the electrical pin connector free ends 455, are pointing downwards towards the carriage plate 400.

Figure 6A:
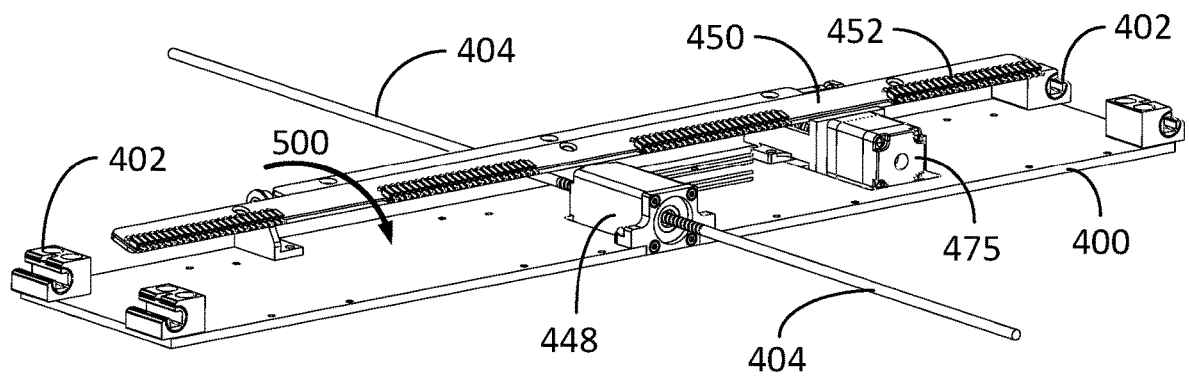
FIG. 6A illustratively depicts and isometric line drawing of the carriage as viewed from the server back without the power modules (and other componentry) to simplify depicting downward rotation of the pivot bar consistent with embodiments of the present invention.
Figure 6B:
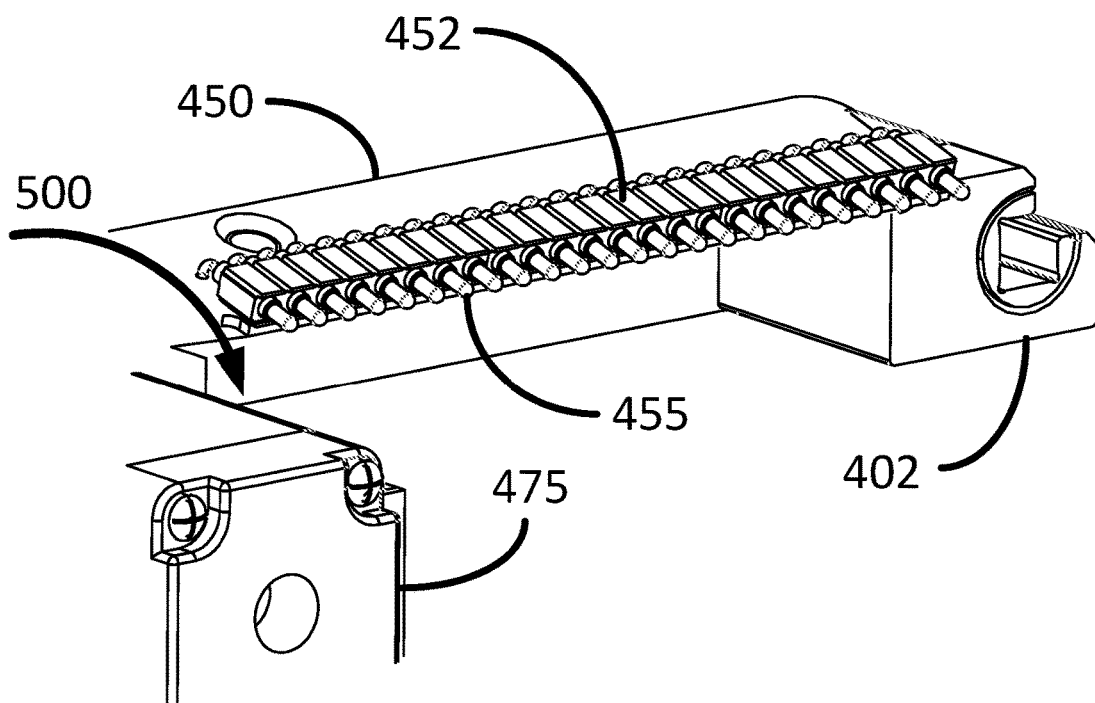
FIG. 6B illustratively depicts an enlarged (zoomed in) view of single set of electrical pin connectors with the pivot bar tilted downward.

FIG. 6A illustratively depicts and isometric line drawing of the carriage 400 as viewed from the server back 104 without the power modules 410 (and other componentry) to simplify depicting downward rotation of the pivot bar 450 consistent with embodiments of the present invention. The pivot bar 450 is tilted downward as indicated by the curved arrow 500. When in the downward tilted configuration 500, the carriage 400 is free to move without obstruction in order to traverse under the array of dummy HDDs 150 in the server 100. FIG. 6B illustratively depicts an enlarged (zoomed in) view of single set of electrical pin connectors 452 with the pivot bar 450 tilted downward 500. In the present embodiment, the twenty four electrical pins 455 are configured and arranged to contact twenty four corresponding electrical pads 220, such as are disposed on the tab 225 that extends from the PCB 210. In the present embodiment, the electric pin connectors 452 generally comprise a plurality of electrical pins 455 that each extend from a spring-loaded housing 454. The spring-loaded housing 454 possesses an internal spring (not shown) that facilitates axial movement with a spring force resistance of the electrical pins 455 so that when a pin 455 mates/contacts with a corresponding electrical pad 220, constant pressure can be maintained between the electrical pad 220 and the electrical pin tip 455. In this way, the spring-loaded pins 455 can accommodate the real-life tolerances of the mechanical parts in the server 100.

Figure 6C:
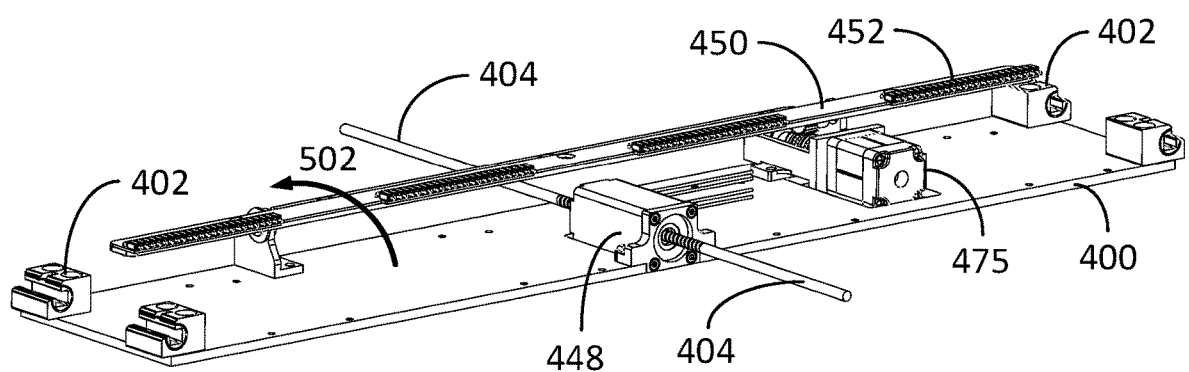
FIG. 6C illustratively depicts an isometric line drawing of the carriage of FIG. 6A depicting upward rotation of the pivot bar consistent with embodiments of the present invention.

FIG. 6C illustratively depicts an isometric line drawing of the carriage 400 of FIG. 6A depicting upward rotation of the pivot bar 450 consistent with embodiments of the present invention. In this figure, the pivot bar 450 is tilted upward as indicated by the curved arrow 502. When in the upward tilted configuration 502, the carriage 400 is positioned to engage the electrical pads 220 comprised by the dummy HDD 150.

Figure 7A:
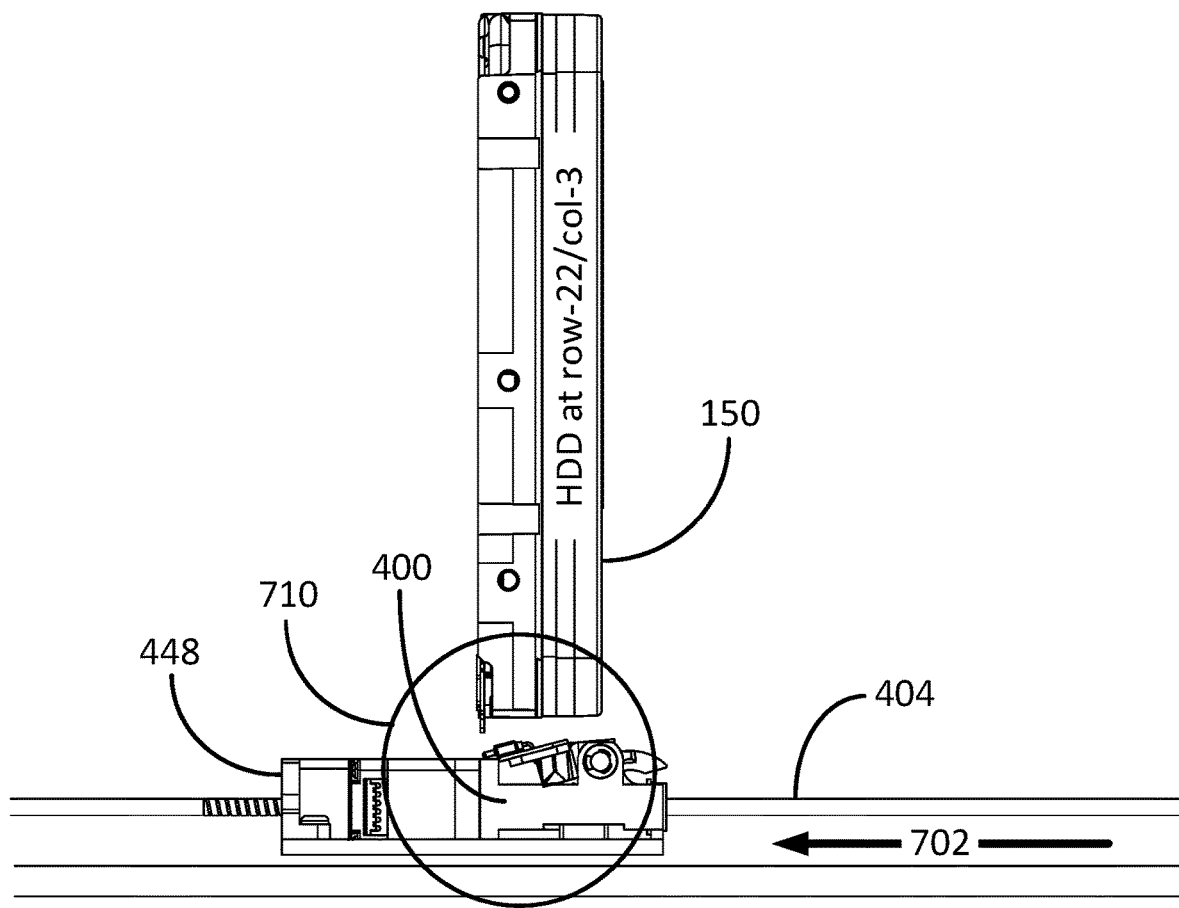
FIGS. 7A-7D illustratively depict line drawings of various side views of the carriage and power modules with relation to a dummy HDD consistent with embodiments of the present invention.

FIGS. 7A-7D illustratively depict line drawings of various side views of the carriage 400 and power modules 410 with relation to a dummy HDD 150 consistent with embodiments of the present invention. The method steps shown by the block diagram of FIG. 8 are described in view of FIGS. 7A-7D. As shown in FIG. 7A, the pivot bar 450 is tilted downwards 500 so that the carriage 400 can freely move under the array of dummy HDDs 150. In one operational example, a user/consumer of data is desirous of retrieving a data file and makes a request to do so (method step 800). Certain embodiments envision a server data directory (either locally maintained by the server 100 or elsewhere) pointing to the location of the data file on one or more specific dummy HDDs 150 in the server 100, step 802. For example, assuming that the desired data file is stored to (target) dummy HDD 150 at row-22 column-3 124, then the carriage 400 would be made to move along the drivetrain, which in this case is a threaded bar 404 and rails 408, via the carriage motor 448 to row-22, step 804. The connector portion of the carriage 400, pins 452, dummy PCB 210 and dummy HDD 150 are encircled 710 to zoom in on these parts of interest.

Figure 7B:
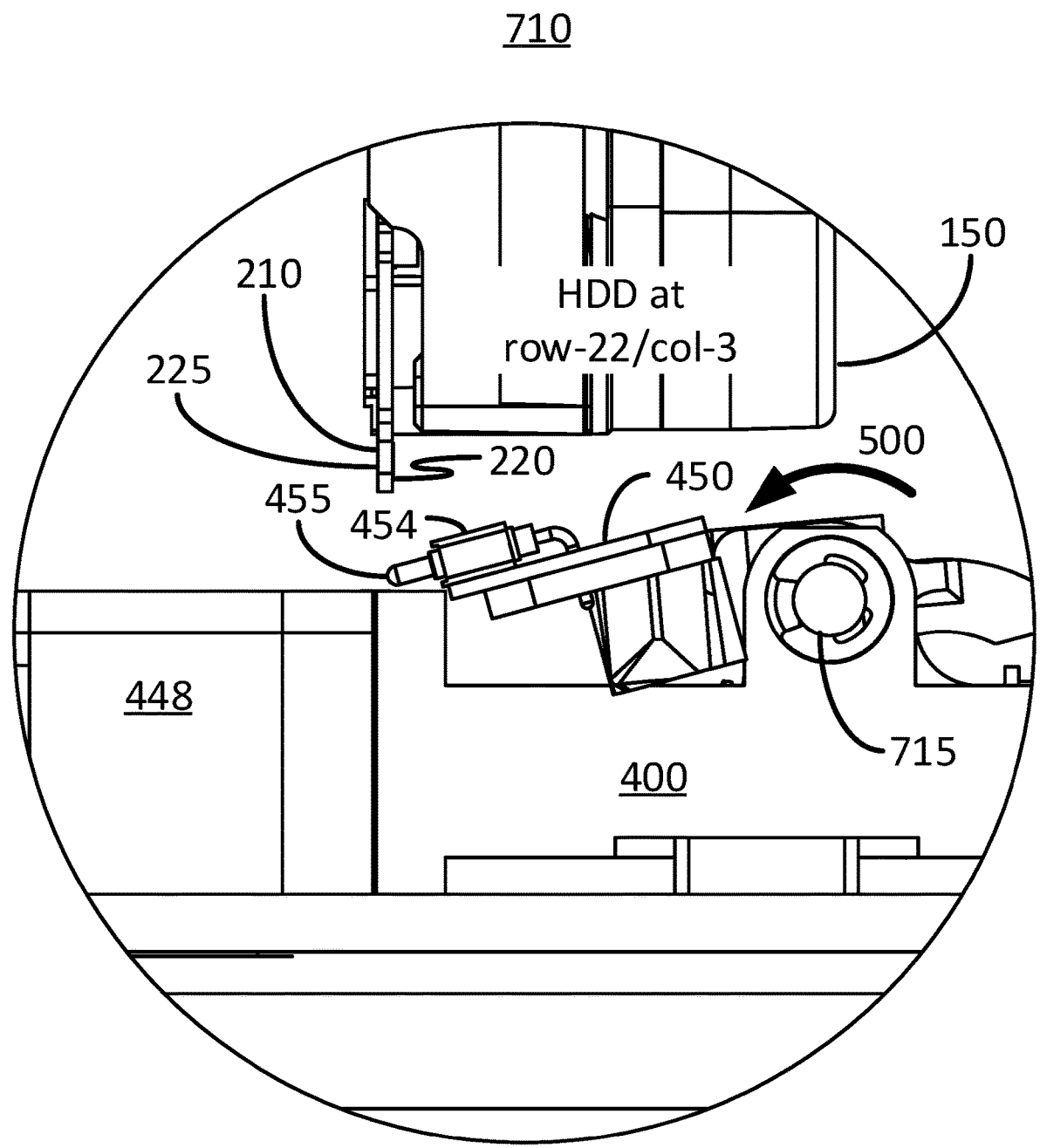
Figure 8:
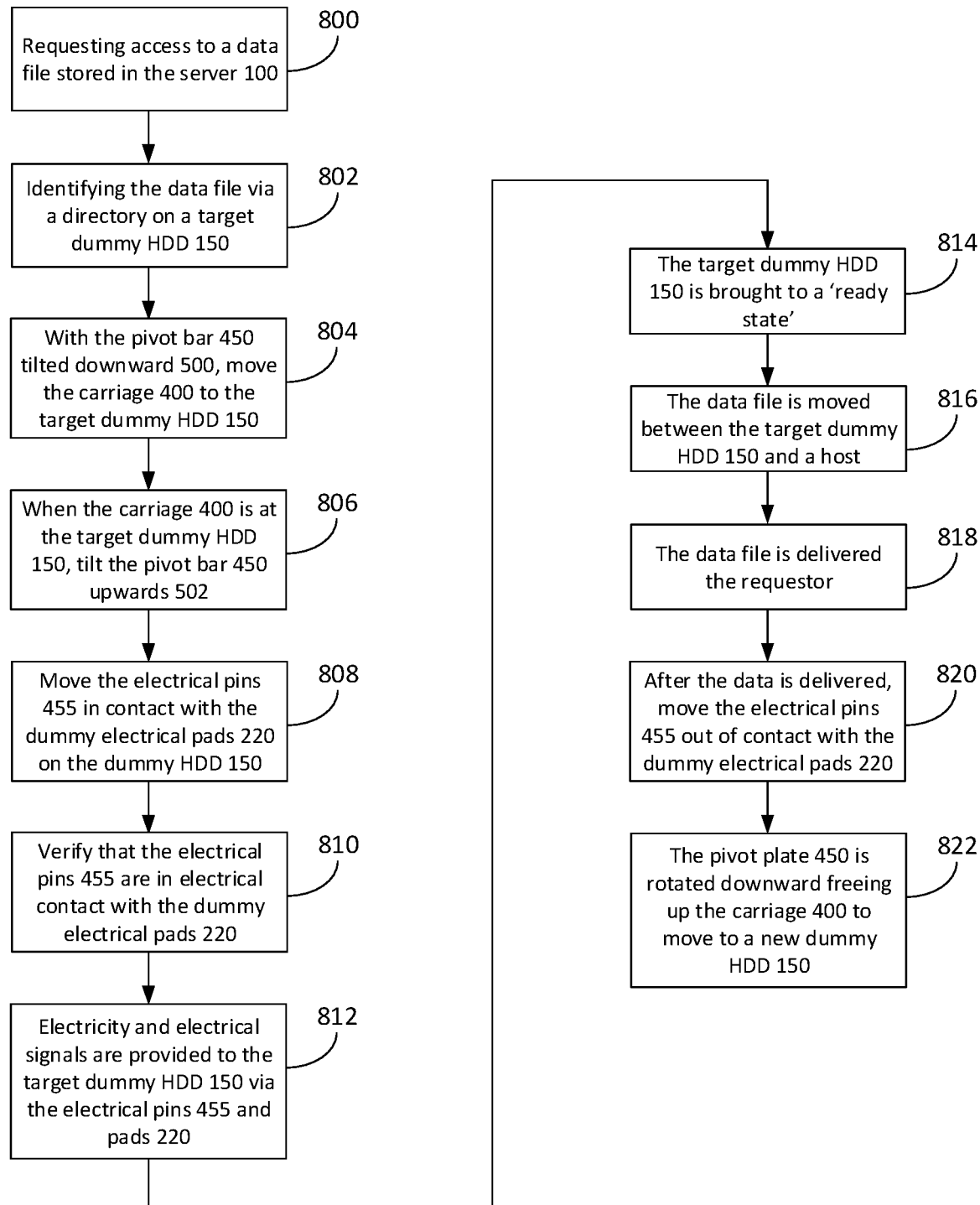
FIG. 8 is a block diagram of method steps describing the function of a dummy HDD server in view of FIGS. 7A-7D consistent with embodiments of the present invention.

FIG. 7B illustratively depicts a line drawing of the circle 710 of FIG. 7A showing the spring-loaded pins 455 located just below the dummy HDD electrical pads 220 facing the server front 108. As shown with more clarity, the pivot bar 450 is pivoted downward 500 about the pivot point 715. Also to be appreciated in this embodiment, the PCB tab 225 extends from the dummy PCB 210 below the bottom side of the dummy HDD 150. With the carriage 400 in a position for the electrical pins 455 to engage the electrical pads 220, the pivot motor 475 is energized to make the pivot bar 450 rotate in the upward position 502 to engage the electrical pads 220, step 806. Certain embodiments envision that once the electrical pins 455 are in position to engage the electrical pads 220 (i.e., the pivot bar 450 is rotated upwards 502), there will be a gap between the electrical pads 20 and the electrical pins 455. Accordingly, in this embodiment the carriage motor 448 moves the carriage 400 towards the dummy HDD 150 to close the gap between the electrical pads 220 and the electrical pins 455 to complete the electrical contact required to electrically power and communicate with the dummy HDD 150, step 808. In the present embodiment, feedback is provided to determine or otherwise verify that the electrical pads 200 are in electrical contact with the pins 455, step 810. Certain embodiments envision electrical contact verification between the pins 455 and the pads 220 providing feedback to the carriage motor 448 that it is fully in position and the gap is closed. Yet other embodiments envision a sensor (not shown) in the carriage 400 or elsewhere that detects mechanical resistance (contact) of the electrical pins 455 compressing against the PCB tab 225 to indicate that the gap is closed.

Figure 7C:
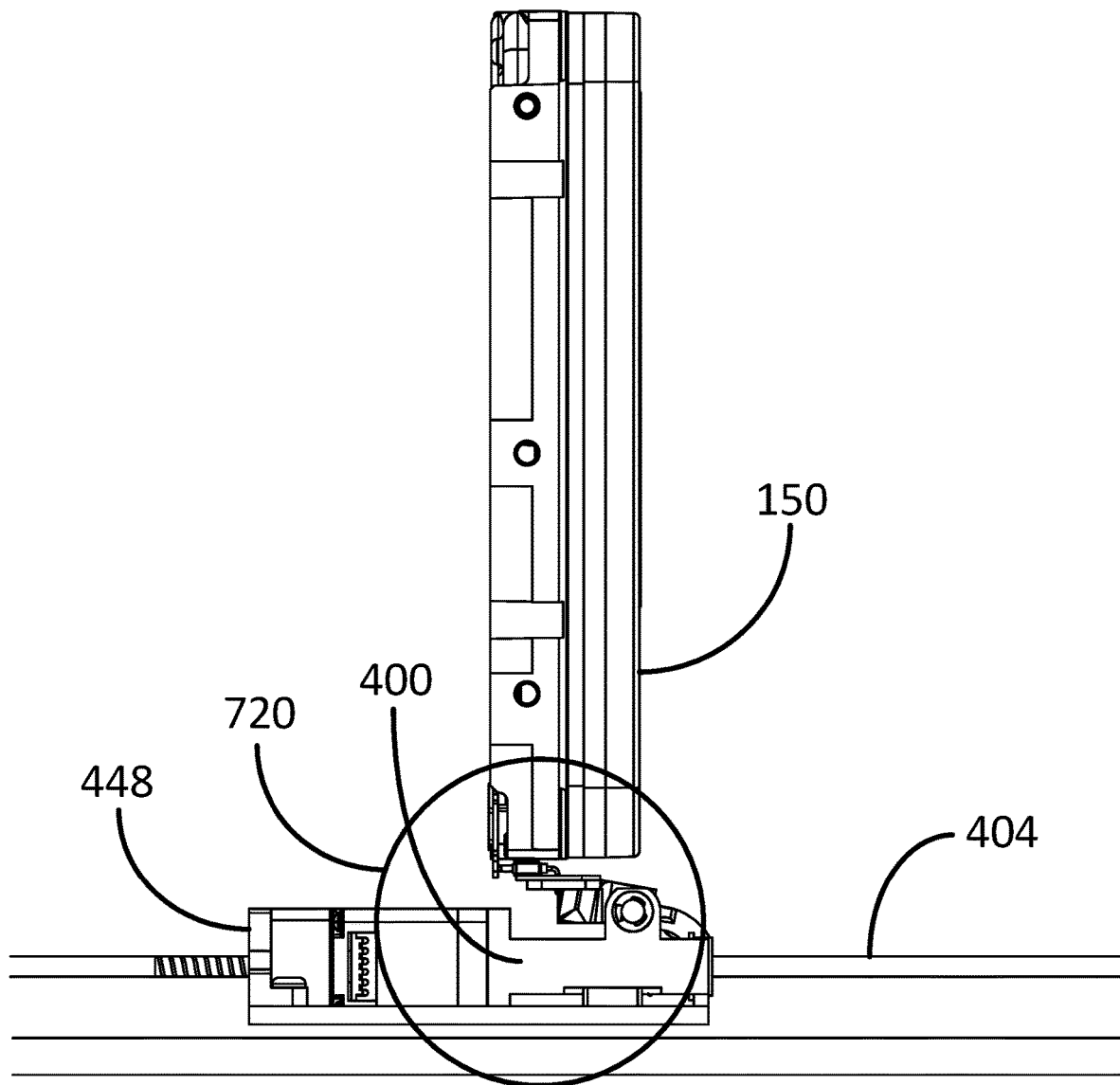

FIG. 7C illustratively depicts a side view line drawing of the electrical pins 455 engaged with the corresponding electrical pads 220 to form an electrical connection between a power source and the dummy HDD 150 via a bus 485 consistent with embodiments of the present invention. The power source could be a power supply built into the server 100 whereby the bus 485 can be a pipeline for power and communication. Certain embodiments envision a motherboard (not shown) in the server 100 connected to the power supply (not shown) and external data connections 112 and 114, the motherboard (not shown) being interposed between at least a) the power supply and the external data connections 112 and 114, and b) the bus 485. Other embodiments envision an external controller and power supply servicing the server 100, and perhaps a plurality of servers. The connector portion of the carriage 400, pins 452, dummy PCB 210 and dummy HDD 150 are encircled 720 to zoom in on these parts of interest.

Figure 7D:
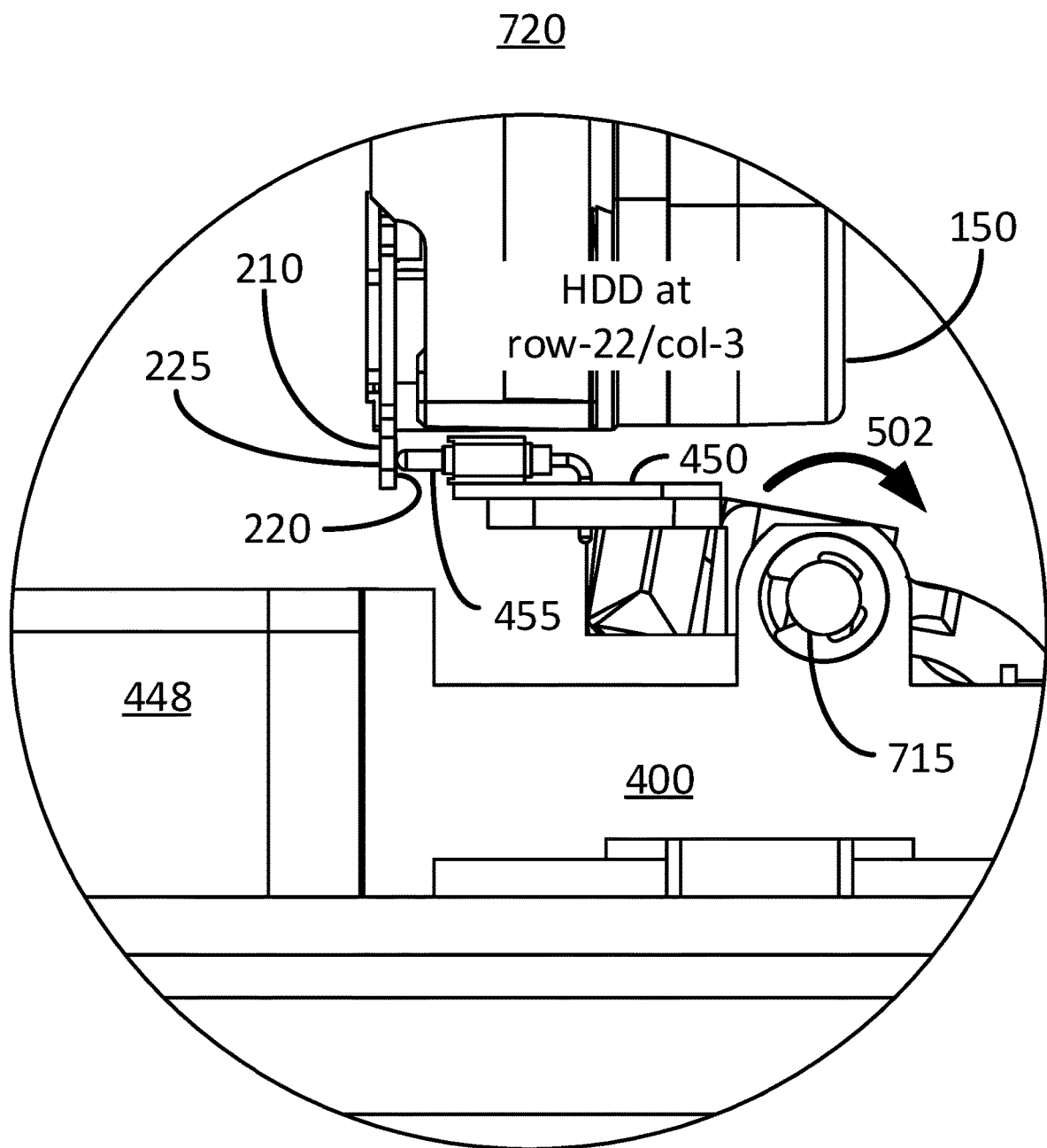

FIG. 7D illustratively depicts a line drawing of the circle 720 of FIG. 7C showing the spring-loaded pins 455 located just below the dummy HDD electrical pads 220 facing the server front 108. As shown in higher resolution, the pivot bar 450 is pivoted upwards 502 about the pivot point 715. The electrical pins 455 are engaged with (and in this case compressed or otherwise spring-loaded against) the electrical pads 220 on the PCB tab 225 that extends from the dummy PCB 210. As shown, the extended PCB tab 225 provides a contact interface for the electrical pins 452 to electrically connect with the electrical pads 220 in the tight space between the rows and under the dummy HDDs 150 (as shown in FIG. 2A). After electrical contact between the electrical pins 452 and the electrical pads 220 is established, electrical power is supplied to the dummy HDD 150 via the bus 485. Furthermore, transmission of electrical signals and communication between dummy HDD 150 and the chipset on the power module 410 is made through the electrical pins 455, step 812. As previously mentioned, optional embodiments envision the chipset functionality possessing a number of different configurations, whether internal to the server 100 or external to the server 100. The dummy HDD 150 is then brought to a ready state whereby the dummy HDD 150 (at row-22, column-3) is prepared to receive data from a client/user data or transmit data stored on the target dummy HDD 150 for the client/user of data, step 814. Because the client/user of data is seeking a file from the target dummy HDD 150 at row-22, column-3, the data file is transmitted from the selected/target dummy HDD 150 through the power module 410, out the server 100, and to the client/user data, step 816. This is typically accomplished via a host and the host computing system and (the host) bus 485. After all storage operations are completed with the target dummy HDD 150 at row-22, column-3 (in this example the data file is delivered to the user of data/requestor, step 820), the carriage motor 448 reverses direction thereby disconnecting the electrical pins 455 from the electrical pads 220, step 820. Next, the pivot plate 450 is rotated downwards 500 about the pivot point 715 into a carriage traversing geometry whereby the carriage 400 is free to move across the rows 120-126 of dummy HDDs 152 position at a new target dummy HDD 154 for new storage related activities, step 822.

With the present description in mind, some embodiments of the present invention therefore contemplate:

A dummy hard disk drive (HDD) 150 comprising: at least one magnetic disk 10 mounted to a spindle motor 12, the spindle motor 12 attached to a base plate 18, the at least one magnetic disk 10 consisting of a rigid disk smaller than 4 inches in diameter; a plurality of magnetic heads 8 each located distally on spring-loaded suspension 6, each of the spring-loaded suspensions 6 swaged 7 to an E-block 17, the E-block 17 attached to a pivot bearing 4, the pivot bearing 4 attached to the base plate 18, the magnetic heads 8 confined to an arched pathway over the at least one magnetic disk 10 because of the pivot bearing 4; a primary circuit board 210 devoid of an onboard disk drive controller 64, the onboard disk drive controller 64 is configured to facilitate communication between the dummy HDD and a central processing unit (CPU); a plurality of electrical contact points 220 that are configured to electrically cooperate with a plurality of corresponding electrical connectors 504, the electrical connectors 504 are external to the dummy HDD; and the electrical connectors 504 electrically connected to an external disk drive controller 64 that is adapted to control at least the dummy HDD and a different dummy HDD.

The dummy HDD 150 embodiment further envisioning wherein the dummy HDD is incapable of performing primary or basic functions without the external disk drive controller 64.

The dummy HDD 150 embodiment further envisioning wherein the spindle motor 12, the at least one magnetic disk 10, the plurality of magnetic heads 8 the E-block 17, and the pivot bearing 4 are essentially encased within a top cover 206, a base 208, a top side 202, a bottom side 205, and two sides 204. Further, the plurality of electrical contact points 220 are electrical connector pads 220 disposed on a bottom edge 226 of the primary circuit board 210, the bottom edge 226 is located at the bottom side 205. Additionally, the bottom side is a tab that extends from a dummy HDD perimeter 230 defined by the top side 202, the bottom side 205, and the two sides 204, or optionally the electrical contact points 220 are configured to electrically connected with a plurality of corresponding electrical pins 504. The dummy HDD 150 embodiment is further envisioned wherein the plurality of corresponding electrical pins are connected an external with disk drive controller 64, the external disk drive controller 64 is configured to facilitate communication between the dummy HDD 150 and a central processing unit (CPU), the external disk drive controller 64 is not located within or on the dummy HDD 150. Further, wherein the dummy HDD 150 is incapable of coming ready without the external disk drive controller 64.

Other embodiments contemplate a reduced component hard disk drive (HDD) 150 comprising: a spindle motor 12 consisting of at least one magnetic disk 10 less than 4 inches in diameter, at least one magnetic read/write head 8 configured to read and write data to the at least one magnetic disk 10; and a primary circuit board 210 electrically connected with a plurality of electrical contact points 220, electrical connectors 504 that are external to the dummy HDD 150 are configured to electrically connect with the electrical contact points 220, the electrical connectors 504 are electrically connected with a shared disk drive controller 64 that is also external to the dummy HDD 150, the shared disk drive controller 64 is configured to be shared with a plurality of other dummy HDDs one at a time, the shared disk drive controller 64 comprises required logic to bring the dummy HDD 150 to a ready state when the dummy HDD 150 is powered, the dummy HDD 150 devoid of an HDD controller with the required logic.

The reduced component HDD 150 embodiment further envisioning wherein the shared disk drive controller 64 is configured to facilitate data communication between the dummy HDD 150 and a central processing unit (CPU).

The reduced component HDD 150 embodiment further envisioning wherein the electrical contact points 220 are electrical pads and the electrical connectors 504 are electrical pins.

The reduced component HDD 150 embodiment further envisioning wherein the electrical connectors 504 are robotically moved between the dummy HDD 150 and the plurality of other dummy HDDs.

The reduced component HDD 150 embodiment further envisioning wherein the primary circuit board 210 possesses a lip 225 that extends at least 3 mm beyond an HDD perimeter defined by an HDD base plate 208.

Yet other embodiments contemplate method for operating a dummy HDD 150, the method comprising: providing a first dummy HDD 150 that comprises at least one magnetic disk 10 mounted on a spindle motor 12, a head stack assembly (HSA) 17 at least one magnetic read write head 8; robotically moving a power module 410 from a second dummy HDD 150 to the first dummy HDD 150; after the moving step, engaging the first dummy HDD 150 with the power module 410; and after the engaging step, supplying power and disk drive controller logic to the first dummy HDD 150 and bringing the first dummy HDD 150 to a ready state, the first dummy HDD 150 is devoid of the disk drive controller logic independent of the power module 410.

The method embodiment further envisioning wherein the disk drive controller logic is built into a disk drive controller 64. It is further envisioned that the disk drive controller 64 is built into the power module 410.

The method embodiment further envisioning wherein the first dummy HDD 150 comprises a primary circuit board 210 that electrically links the spindle motor 12 and the HSA 17 to the power module 410 via a pin and pad connection from electrical pins comprised by the power module and corresponding electrical pads disposed on the primary circuit board 210. This method embodiment is further envisioned wherein the electrical pads are disposed on a primary circuit board lip 225 that extends at least 3 mm beyond an HDD perimeter defined by an HDD base plate 208.

The method embodiment further envisioning wherein data is transferred to the second dummy HDD 150 and stored to the second dummy HDD 150 via the power module 410 when the second dummy HDD 150 is engaged with the power module 410 prior to the moving step.

The method embodiment further envisioning wherein data is transferred to the first dummy HDD 150 and stored to the first dummy HDD 150 via the power module 410 after the supplying step.

While other embodiments contemplate a disk drive server 100 comprising: at least one row 120 of hard disk drives (HDDs), each of the HDDs 150 defined by a front surface 206, a back surface 208, and an edge perimeter 230; an HDD printed circuit board 210 attached to each of the back surfaces 208, a contact lead portion 225 of the HDD printed circuit board 210 extending beyond the edge perimeter 230; a plurality of electrical connector pads 220 disposed on the portion of the HDD printed circuit board 225; an electrically powered carriage 400 configured to traverse along the row of HDDs 120, the carriage 400 further configured to be electrically powered 485, the carriage 400 comprising at least one articulating pin connector 452; and a plurality of electrical pins 504 extending from each of the articulating pin connector 452, the electrical pins 504 electrically connect with the electrical connector pads 220 when the articulating pin connector 452 is in a first position (FIG. 6C), the electrical pins 504 cannot electrically connect with the electrical connector pads 220 when the articulating pin connector 452 is in a second position (FIG. 6A).

The disk drive server 100 embodiment further comprising a bus 485 that is connected to the carriage 400, the bus 485 configured to carry electrical power and electrical signals to and from the HDD 150 via the electrical pins 504 when connected with the electrical connector pads 220.

The disk drive server 100 embodiment further envisioning wherein the at least one articulating pin connector 452 is adapted to pivot between the first and the second positions.

The disk drive server 100 embodiment further envisioning wherein the carriage 400 can freely traverse along the row of HDDs 120 only when the articulating pin connector 452 is in the first position.

The disk drive server 100 embodiment further envisioning wherein the electrical connector pads 220 include data transfer pads, spindle motor power pads, and voice coil motor power pads.

The disk drive server 100 embodiment further envisioning wherein the plurality of electrical pins 504 are spring-loaded.

The disk drives server 100 embodiment further envisioning the carriage 400 comprises four articulating pin connectors 452 that are each attached to a pivot bar 450. wherein each of the four articulating pin connectors 452 services a corresponding row of HDDs 150.

The disk drive server 100 further comprising data network interface connectors 112/114.

Yet other embodiments contemplate an HDD server 100 comprising: at least one row of dummy hard disk drives (HDDs) 150; a plurality of electrical connector pads 220 extending from each of the dummy HDDs 150; a carriage 400 possessing at least one articulating pin connector 452, the articulating pin connector 452 is electrically and communicatively connected with the electrical connector pads 220 of one of the dummy HDDs 150 when the articulating pin connector is in a first position, the articulating pin connector 452 is only movable between the plurality of dummy HDDs 150 when the articulating pin connector 452 is in a second position.

The HDD server 100 embodiment further envisioning wherein at least some logic commands required to bring the dummy HDD ready is externally located from the dummy HDDs 150. This embodiment further envisions wherein the at least some logic commands are located on the carriage 400.

The HDD server 100 embodiment further envisioning wherein the articulating pin connector 452 comprises a plurality of electrical pins 455 that extend from a pivot bar 450 that pivots between the first position and the second position.

The HDD server 100 embodiment further comprising a first row 120 and a second row 122 of dummy HDDs 150, the carriage 400 comprising a first articulating pin connector 452 aligned with the first row 120 and the second pin connector 452 aligned with the second row 122.

A different embodiment contemplates a method for connecting a dummy hard disk drive (HDD) 150 in a dummy HDD server 100, the method comprising: providing a first row 120 of dummy HDDs 150 inside of the dummy HDD server 100, each of the dummy HDDs 150 are devoid of required necessary logic to come ready, a carriage 400 comprising a first articulating pin connector 452; while the first articulating pin connector 452 is in a first position 500, moving the carriage 400 along the first row 120 to a first dummy HDD 150; when at the first dummy HDD 150, positioning the first articulating pin connector 452 in a second position 502, while in the second position the carriage 400 is prevented from moving along the first row 120; and electrically connecting the first articulating pin connector 452 to the first dummy HDD 150 while in the second position.

The method further envisioning wherein the articulating pin connector 452 is attached to a pivot plate 450, the pivot plate 450 pivoting between the first position 500 and the second position 502 during the positioning step.

The method envisioning further comprising physically contacting the first articulating pin connector 452 with the first dummy HDD 150 prior to the electrically connecting step wherein the articulating pin connector 452 comprises a plurality of spring-loaded electrical pins 455 that contact corresponding electrical pads 220 comprised by the first dummy HDD 150.

The method further envisioning wherein the required necessary logic come ready is provided to the first dummy HDD 150 by way of an external controller device an external power transmitted via the articulating pin connector 452.

The method further envisioning wherein the external controller device includes all of the necessary logic to operate the first dummy HDD 150.

The method further envisioning wherein the electrically connecting step is accomplished by way of a feedback system to the motor ensuring electrical conductivity.

The method envisioning further comprising storing and retrieving user data with the first dummy HDD 150 for a client.

The method further envisioning further comprising physically disconnecting the first articulating pin connector 452 from the first dummy HDD 150; repositioning the first articulating pin connector 452 from the second position 502 to the first position 500; and moving the carriage 400 to a second dummy HDD 150 along the first row; when at the second dummy HDD 150, positioning the first articulating pin connector 452 in the second position 502; and electrically connecting the first articulating pin connector 452 to the second dummy HDD 150 while in the second position.

The method envisioning further comprising a second row of dummy HDDs 122 and a second articulating pin connector 452 aligned with the second row of dummy HDDs 122.

Some arrangements of the present invention are envisioned to comprise a power module 410 comprising: a hard disk drive (HDD) microcontroller 64; a bus connector 446 configured to connect with a power bus 485 that provides power and communication to the power module 410; and a two position connector pin array 453 that comprises a plurality of connector pins 452 that correspond to an array of electrical pads 220 from a dummy HDD 150, the dummy HDD devoid of at least an onboard HDD microcontroller 64, the two position connector pin array 453 configured to connect with the dummy HDD 150 when in a first position but not configured to connect with the dummy HDD 150 when in a second position.

The power module 410 embodiment further comprising a hard disk drive solid state buffer memory chip.

The power module 410 embodiment further envisioning wherein the hard disk drive microcontroller 64 includes a hard disk drive motor controller.

The power module 410 embodiment further comprising a hard disk drive motor controller integrated circuit chip.

The power module 410 embodiment further envisioning wherein the power bus 485 possesses an individual electrical line corresponding to each of the electrical pins 452.

The power module 410 embodiment further envisioning wherein the connector pins 452 are spring-loaded.

The power module 410 embodiment further envisioning wherein the power module 410 comprises all functionality not onboard the dummy HDD 150 that would otherwise complete a standalone HDD 99.

The power module 410 embodiment further envisioning wherein the two position connector pin array 453 is tilted downward in the first position and tilted upward in the second position.

The power module 410 embodiment further envisioning wherein the power module 410 attached to a carriage 400, the carriage 400 is configured to traverse an array of dummy HDDs 150.

The power module 410 embodiment further envisioning wherein the electrical pads 220 extend from a periphery 230 of the dummy HDD 150.

Other arrangements of the present invention contemplate a power module 410 operation method comprising: supplying power and the communication link to the power module 410 via a power and communication bus 485 that is connected to the power module 410; receiving instructions to engage a dummy HDD 150; moving a two position connector pin array 453 from a first position 500 to a second position 502, the pin array 453 comprises a plurality of connector pins 452; after the moving step, electrically engaging the plurality of connector pins 452 with a pad array 221 disposed on the dummy HDD 150, the pad array 221 that corresponds with the pin array 453; and providing controller functionality 64 to the dummy HDD, the controller functionality required to bring the dummy HDD 150 to a ready state, the dummy HDD 150 devoid of at least an onboard HDD controller functionality.

The power module 410 operation method embodiment further envisioning wherein the controller functionality is built-in to a hard disk drive microcontroller 64.

The power module 410 operation method embodiment further comprising disengaging the power module 410 from the dummy HDD 150 and moving the two position connector pin array 453 from the second position 502 to the first position 500.

The power module 410 operation method embodiment further comprising a hard disk drive motor controller integrated circuit chip on the power module 410, the dummy HDD devoid of motor controller capability.

The power module 410 operation method of claim 11 wherein the two position connector pin array 453 rotates from the first position 500 to the second position 502 by way of a pivoting motion.

The power module 410 operation method embodiment further envisioning wherein the power module 410 further possesses a primary hard disk drive solid state buffer memory chip 66, the dummy HDD 150 devoid of buffer memory functionality other than hard disks 10 in the dummy HDD 150.

The power module 410 operating method embodiment further envisioning wherein the pin array 453 is tilted downward when in the first position 500 and the connector pins 452 are orthogonal to the pad array 221 when in the second position.

The power module 410 operating method embodiment further comprising prior to the moving step, traversing an array of dummy HDDs 150 with the pin array 453 in the first position.

While still other arrangements consistent with the present invention envision a dummy HDD power module 410 comprising: a hard disk drive (HDD) microcontroller 64 with HDD microcontroller functionality; an HDD spindle motor controller with HDD spindle motor controller functionality configured to maintain HDD spindle motor speed within a tolerance of +/−0.2%; a bus connector 446 configured to connect with a power bus 485 that provides power and communication to the power module 410; and a two position connector pin array 453 that comprises a plurality of connector pins 452 that correspond to an array of electrical pads 220 from a dummy HDD 150, the dummy HDD devoid of the HDD motor controller functionality and the spindle motor controller functionality, the two position connector pin array 453 configured to connect with the dummy HDD 150 when in a first position but not configured to connect with the dummy HDD 150 when in a second position.

The dummy HDD power module 410 embodiment further envisioning wherein the two position connector pin array 453 is tilted downward in the first position and tilted upward in the second position.

The above embodiments are not intended to limit the scope of the invention whatsoever because many more embodiments are easily conceived within the teachings and scope of the instant specification.

It is to be understood that even though numerous characteristics and advantages of various embodiments of the present invention have been set forth in the foregoing description, together with the details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the power module may also contain one or two two-pole magnets on board without departing from the scope and spirit of the present invention. A number of different electrical connector/contact embodiments that cause conductivity between a dummy HDD and in power module are envisioned from pins and pads, to pins and sleeves, to plugs without departing from the scope and spirit of the present invention. Though the chipset shown on the power module, such a configuration is hardly necessary and can be functionally elsewhere while staying within the scope and spirit of the present invention. Other common components can be extracted from a traditional HDD and included with the power/enabler module, many different shapes configurations of the dummy HDD are conceivable, a number of different shaped power modules are also conceivable without departing from the scope and spirit of the present invention. Certain embodiments envision more than one chassis in a single server box with more than one row of dummy HDDs being activated at any given time without departing from embodiments within the present invention. Certain other embodiments envision some if not all of the electrical connector pads 220 disposed on both sides of a tab 225 capable of cooperating with one or more sets of connector pins in a dual direction without departing from the scope and spirit of the present invention. Finally, although the preferred embodiments described herein are directed to server systems that use dummy HDDs and enabler modules, it will be appreciated by those skilled in the art that the teachings of the present invention can be applied to other storage devices that can be stripped of common elements and provided with one or more universal modules that completes the storage devices stripped of common elements without departing from the spirit and scope of the present invention.

It will be clear that the present invention is well adapted to attain the ends and advantages mentioned as well as those inherent therein. While presently preferred embodiments have been described for purposes of this disclosure, numerous changes may be made which readily suggest themselves to those skilled in the art and which are encompassed in the spirit of the invention disclosed and as defined in the appended claims.

What is claimed is:

1. A disk drive server comprising:
   at least one row of hard disk drives (HDDs), each of the HDDs defined by a front surface, a back surface, and an edge perimeter;
   an HDD printed circuit board attached to each of the back surfaces, a contact lead portion of the HDD printed circuit board extending beyond the edge perimeter;
   a plurality of electrical connector pads disposed on the portion of the HDD printed circuit board;
   a carriage comprising at least one articulating pin connector; and
   a plurality of electrical pins extending from each of the articulating pin connector, the electrical pins configured to electrically connect with the electrical connector pads when the articulating pin connector is in a first position, the electrical pins cannot electrically connect with the electrical connector pads when the articulating pin connector is in a second position, the carriage configured to traverse along the row of HDDs only when the articulating pin connector is in the second position.

2. The disk drive server of claim 1 further comprising a bus that is connected to the carriage, the bus configured to carry electrical power and electrical signals to and from the HDD via the electrical pins when connected with the electrical connector pads.

3. The disk drive server of claim 1 wherein the at least one articulating pin connector is adapted to pivot between the first and the second positions.

4. The disk drive server of claim 1 wherein the electrical connector pads include data transfer pads, spindle motor power pads, and voice coil motor power pads.

5. The disk drive server of claim 1 wherein the plurality of electrical pins are spring-loaded.

6. The disk drives server of claim 1 wherein the carriage comprises four articulating pin connectors that are each attached to a pivot bar.

7. The disk drives server of claim 6 wherein each of the four articulating pin connectors services a corresponding row of HDDs.

8. The disk drive server of claim 1 further comprising data network interface connectors.

9. A disk drive server comprising:
at least one row of dummy hard disk drives (HDDs);
a plurality of electrical connector pads extending from each of the dummy HDDs;
a carriage possessing at least one articulating pin connector, the articulating pin connector is electrically and communicatively connected with the electrical connector pads of one of the dummy HDDs when the articulating pin connector is in a first position, the articulating pin connector is only movable between the plurality of dummy HDDs when the articulating pin connector is in a second position.

10. The disk drives server of claim 9 wherein at least some logic commands required to bring the dummy HDD ready is externally located from the dummy HDDs.

11. The disk drives server of claim 10 wherein the at least some logic commands are located on the carriage.

12. The disk drives server of claim 9 wherein the articulating pin connector comprises a plurality of electrical pins that extend from a pivot bar that pivots between the first position and the second position.

13. The disk drives server of claim 9 further comprising a first row and a second row of dummy HDDs, the carriage comprising a first articulating pin connector aligned with the first row and the second pin connector aligned with the second row.

14. A method for connecting a dummy hard disk drive (HDD) in a dummy HDD server, the method comprising:
providing a first row of dummy HDDs inside of the dummy HDD server, each of the dummy HDDs are devoid of required necessary logic to come ready, a carriage comprising a first articulating pin connector;
only while the first articulating pin connector is in a first position, moving the carriage along the first row to a first dummy HDD;
when at the first dummy HDD, positioning the first articulating pin connector in a second position, while in the second position the carriage is prevented from moving along the first row; and
electrically connecting the first articulating pin connector to the first dummy HDD while in the second position.

15. The method of claim 14 wherein the articulating pin connector is attached to a pivot plate, the pivot plate pivoting between the first position and the second position during the positioning step.

16. The method of claim 14 further comprising physically contacting the first articulating pin connector with the first dummy HDD prior to the electrically connecting step wherein the articulating pin connector comprises a plurality of spring-loaded electrical pins that contact corresponding electrical pads comprised by the first dummy HDD.

17. The method of claim 14 wherein the required necessary logic come ready is provided to the first dummy HDD by way of an external controller device an external power transmitted via the articulating pin connector.

18. The method of claim 17 wherein the external controller device includes all of the necessary logic to operate the first dummy HDD.

19. The method of claim 14 wherein the electrically connecting step is accomplished by way of a feedback system to the motor ensuring electrical conductivity.

20. The method of claim 14 further comprising storing and retrieving user data with the first dummy HDD for a client.

21. The method of claim 20 further comprising physically disconnecting the first articulating pin connector from the first dummy HDD; repositioning the first articulating pin connector from the second position to the first position; and moving the carriage to a second dummy HDD along the first row; when at the second dummy HDD, positioning the first articulating pin connector in the second position; and electrically connecting the first articulating pin connector to the second dummy HDD while in the second position.

* * * * *